ial(12) United States Patent
Pan et al.

(10) Patent No.: US 8,768,997 B2
(45) Date of Patent: Jul. 1, 2014

(54) PASSIVE SWITCHED-CAPACITOR FILTERS CONFORMING TO POWER CONSTRAINT

(75) Inventors: Chengzhi Pan, San Diego, CA (US); Joseph Burke, Glenview, IL (US)

(73) Assignee: QUALCOMM Incorporated, San Diego, CA (US)

( * ) Notice: Subject to any disclaimer, the term of this patent is extended or adjusted under 35 U.S.C. 154(b) by 1085 days.

(21) Appl. No.: 12/366,363

(22) Filed: Feb. 5, 2009

(65) Prior Publication Data
US 2010/0198898 A1  Aug. 5, 2010

(51) Int. Cl.
*G06G 7/02* (2006.01)
(52) U.S. Cl.
USPC .......................................................... 708/819
(58) Field of Classification Search
CPC ..... H03H 15/00; H03H 15/02; H03H 19/004; H03H 11/04; G03G 7/1928
USPC .......................................................... 708/819
See application file for complete search history.

(56) References Cited

U.S. PATENT DOCUMENTS

| 6,329,939 | B1 * | 12/2001 | Swaminathan et al. ...... 341/143 |
| 6,643,675 | B2 | 11/2003 | Piirainen |
| 2003/0035499 | A1 | 2/2003 | Staszewski et al. |
| 2005/0233725 | A1 | 10/2005 | Muhammad et al. |
| 2006/0284751 | A1 | 12/2006 | San et al. |
| 2008/0088389 | A1 | 4/2008 | Iida |
| 2009/0009155 | A1 | 1/2009 | Hosokawa et al. |

FOREIGN PATENT DOCUMENTS

| CN | 101083457 A | 12/2007 |
| DE | 102004059207 A1 | 6/2006 |
| JP | 2002064380 A | 2/2002 |
| JP | 2006352455 A | 12/2006 |
| JP | 2007324659 A | 12/2007 |
| JP | 2009005088 A | 1/2009 |
| WO | 0225803 A2 | 3/2002 |

OTHER PUBLICATIONS

Andrea Gerosa, et al., "2-D Video Rate SC FIR Filters Based on Analog RAM's", IEEE/ACM Transactions on Networking, IEEE / ACM, New York, Ny, US, vol. 7, No. 6, Dec. 1, 1999, XP011013525, ISSN, 1063-6692.

(Continued)

*Primary Examiner* — Tan V. Mai
(74) *Attorney, Agent, or Firm* — Kevin T. Cheatham

(57) ABSTRACT

Passive switched-capacitor (PSC) filters are described herein. In one design, a PSC filter implements a second-order infinite impulse response (IIR) filter with two complex first-order IIR sections. Each complex first-order IIR section includes three sets of capacitors. A first set of capacitors receives a real input signal and an imaginary delayed signal, stores and shares electrical charges, and provides a real filtered signal. A second set of capacitors receives an imaginary input signal and a real delayed signal, stores and shares electrical charges, and provides an imaginary filtered signal. A third set of capacitors receives the real and imaginary filtered signals, stores and shares electrical charges, and provides the real and imaginary delayed signals. In another design, a PSC filter implements a finite impulse response (FIR) section and an IIR section for a complex first-order IIR section. The IIR section includes multiple complex filter sections operating in an interleaved manner.

30 Claims, 14 Drawing Sheets

(56) References Cited

OTHER PUBLICATIONS

Cuypers C, et al., "General synthesis of complex analogue filters", IEE Proceedings, Circuits Devices and Systems, Institution of Electrical Engineers, Stenvenage, GB LNKDDOI,10.1049/1P-CDS, Aug. 16, 2004, vol. 152, No. 1, Feb. 4, 2005, pp. 7-15, XP006023416, ISSN, 1350-2409.

Ho, et al., "Charge-Doamin Signal Pocessing of Direct RF Sampling Mixer with Discrete-Time Filters in Bluetooth and GSM Receivers", EURASIP Journal on Wireless Communications and Networking, Hindawi Publishing, vol. 2006, pp. 1-14.

International Search Report and Written Opinion—PCT/US2010/023015—ISA/EPO—Mar. 14, 2011.

Maskell D L, et al., "Analysis of even order IIR digital filters implemented as a cascade of first order complex allpass sections", Jun. 7-9, 1988, pp. 531-534, XP010069605.

Muhammad et al., "First Fully Integrated Quad-Band GSM GPRS Receiver in a 90-nm Digital Cmos Process", Journal of Solid State Circuits, vol. 41, No. 8 Aug. 2006.

Petraglia A et al.," Random capacitance ratio error effects in the frequency response of switched-capacitor filters", Analog and Mixed IC Design, IEEE-CAS Region 8 Workshop on Pavia, Italy Sep. 13-14, 1996, New York, Ny, USA. IEEE, US, Sep. 13, 1996, pp. 112-116, XP010703105, DOI, DOI,10.1109/AMICD.1996.569400 ISBN, 978-0-7803-3625-4.

Proakis J G, et al., "Digital Signal Processing, Principles, Algorithms, and Applications, Passage", Digital Signal Processing, Principles, Algorithms Andapplications, Xx, Xx, Jan. 1, 1996, pp. 519-539, XP002338418.

Yi-Ran Sun, et al., "Implementation of generalized uniform Bandpass Sampling with complex FIR and IIR Filtering", Circuit Theory and Design, 2007, ECCTD 2007, 18th European Conference on, IEEE, Piscataway, NJ, USA, Aug. 27, 2007, pp. 476-479, XP031257787, ISBN, 978-1-4244-1341-6.

Taiwan Search Report—TW099103582—TIPO—Apr. 11, 2013.

* cited by examiner

US 8,768,997 B2

PASSIVE SWITCHED-CAPACITOR FILTERS CONFORMING TO POWER CONSTRAINT

BACKGROUND

I. Field

The present disclosure relates generally to electronics, and more specifically to filters.

II. Background

Filters are commonly used to filter signals to pass desired signal components and to attenuate undesired signal components. Filters are widely used for various applications such as communication, computing, networking, consumer electronics, etc. For example, in a wireless communication device such as a cellular phone, filters may be used to filter a received signal to pass a desired signal on a specific frequency channel and to attenuate out-of-band undesired signals and noise. For many applications, filters that occupy small area and consume low power are highly desirable.

SUMMARY

Passive switched-capacitor (PSC) filters that may occupy smaller area and consume less power are described herein. In one design, a PSC filter may implement a second-order infinite impulse response (IIR) filter with two complex first-order IIR sections. The second-order IIR filter may not meet a power constraint whereas each complex first-order IIR section may meet the power constraint. The coefficients for the two complex first-order IIR sections may be determined based on the coefficients for the second-order IIR filter, as described below. Each complex first-order IIR section may be implemented with a PSC filter section comprising multiple capacitors and multiple switches.

In another design, a PSC filter may implement one or more complex filter sections (e.g., two complex first-order IIR sections) coupled in series. Each complex filter section includes first, second, and third sets of capacitors. The first set of capacitors (e.g., capacitors 1024a and 1034a in FIG. 10) receives a real input signal and an imaginary delayed signal, stores and shares electrical charges, and provides a real filtered signal. The second set of capacitors (e.g., capacitors 1024b and 1034b in FIG. 10) receives an imaginary input signal and a real delayed signal, stores and shares electrical charges, and provides an imaginary filtered signal. The third set of capacitors (e.g., capacitors 1044 and 1054 in FIG. 10) receives the real and imaginary filtered signals, stores and shares electrical charges, and provides the real and imaginary delayed signals. Each complex filter section further includes first, second, third and fourth sets of switches. The first set of switches couples the first set of capacitors to a first summing node. The second set of switches couples the second set of capacitors to a second summing node. The third set of switches couples the third set of capacitors to the first summing node. The fourth set of switches couples the third set of capacitors to the second summing node. Each capacitor stores a value from an associated summing node when selected for charging and shares electrical charge with other capacitors via the associated summing node when selected for charge sharing.

In yet another design, a PSC filter may implement a finite impulse response (FIR) section coupled to an IIR section, which may be for a complex first-order IIR filter. The FIR section receives and filters a complex input signal and provides a complex filtered signal. The IIR section receives and filters the complex filtered signal and provides a complex output signal. The FIR and IIR sections may be implemented with two PSC filter sections. Each PSC filter section may include a bank of complex filter sections that may be enabled in different clock cycles.

In yet another design, a PSC filter section includes first and second complex filter sections and may be used for the FIR or IIR section described above. The first complex filter section receives and filters a complex input signal and provide a complex output signal every M clock cycles, where M is greater than one. The second complex filter section receives and filters the complex input signal and provides the complex output signal every M clock cycles. The first and second complex filter sections may be enabled in different clock cycles. For example, with M=2, the first complex filter section may be enabled in even-numbered clock cycles, and the second complex filter section may be enabled in odd-numbered clock cycles.

Various aspects and features of the disclosure are described in further detail below.

DETAILED DESCRIPTION

The PSC filters described herein may be used for various types of filters such as FIR filters, IIR filters, auto regressive moving average (ARMA) filters composed of FIR and IIR sections, etc. The PSC filters may also implement a filter of any order, e.g., first, second, third or higher order. Multiple PSC filter sections may be used to form more complex filters.

For clarity, PSC filters for second-order FIR filter and for first-order and second-order IIR filters are described in detail below.

A PSC filter may be implemented with only capacitors and switches, without using active circuits. This may provide certain advantages described below. However, due to the passive nature of the PSC filter, not all filter transfer functions may be directly implementable with the PSC filter. The PSC filter can implement a filter transfer function that meets a power constraint. Various schemes to meet the power constraint are described below and are based on observation that the total electrical charges before and after each charge sharing operation in the PSC circuit should be keep constant. This implies that a FIR filter is implementable if its coefficients are scaled so that they sum to 1. For an IIR filter, several schemes for meeting the power constraint are described below and include coefficient scaling, complex filter section decomposition, filter bank transformation, and pole repositioning.

Figure 1:
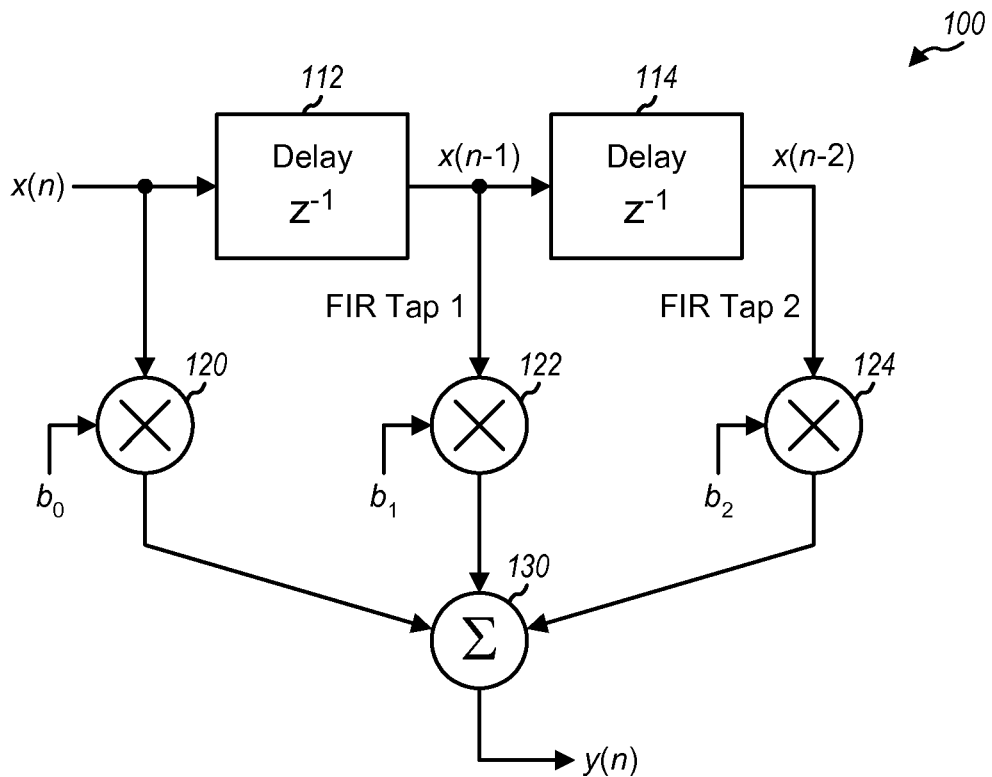
FIG. 1 shows a block diagram of a second-order FIR filter.

FIG. 1 shows a block diagram of a second-order FIR filter 100 that may be implemented with a PSC filter. FIR filter 100 includes two delay elements 112 and 114 coupled in series, with each delay element providing a delay of one clock cycle. Delay element 112 receives an input sample x(n) and provides a delayed sample x(n−1). Delay element 114 receives the delayed sample x(n−1) and provides a delayed sample x(n−2). FIR filter 100 includes two FIR taps 1 and 2 for second order. A multiplier 120 (which may be considered as being for FIR tap 0) is coupled to the input of delay element 112. A multiplier 122 for FIR tap 1 is coupled to the output of delay element 112. A multiplier 124 for FIR tap 2 is coupled to the output of delay element 114. Multipliers 120, 122 and 124 multiply their samples with filter coefficients $b_0$, $b_1$ and $b_2$, respectively. A summer 130 is coupled to the outputs of all three multipliers 120, 122 and 124. Summer 130 sums the outputs of multipliers 120, 122 and 124 and provides an output sample y(n).

The output sample y(n) from FIR filter 100 may be expressed as:

$$y(n) = b_0 \cdot x(n) + b_1 \cdot x(n-1) + b_2 \cdot x(n-2). \quad \text{Eq (1)}$$

A transfer function $H_{FIR}(z)$ for FIR filter 100 in the z-domain may be expressed as:

$$H_{FIR}(z) = b_0 + b_1 \cdot z^{-1} + b_2 \cdot z^{-2}, \quad \text{Eq (2)}$$

where $z^{-k}$ denotes a delay of k clock cycles.

The filter coefficients may be defined to meet the following power constraint for FIR filter:

$$|b_0| + |b_1| + |b_2| = 1. \quad \text{Eq (3)}$$

If coefficients $b_0$, $b_1$ and $b_2$ do not meet the power constraint in equation (3), then the coefficients may be scaled as follows:

$$b_0' = K_{FIR} \cdot b_0, \quad \text{Eq (4a)}$$

$$b_1' = K_{FIR} \cdot b_1, \text{ and} \quad \text{Eq (4b)}$$

$$b_2' = K_{FIR} \cdot b_2, \quad \text{Eq (4c)}$$

$$\text{where } K_{FIR} = \frac{1}{|b_0| + |b_1| + |b_2|} \text{ is a scaling factor.} \quad \text{Eq (4d)}$$

The scaling in equation set (4) results in the scaled coefficients meeting the power constraint, as follows:

$$|b_0'| + |b_1'| + |b_2'| = 1. \quad \text{Eq (5)}$$

Any set of FIR filter coefficients may be scaled to meet the power constraint in equation (5). The power constraint may also be referred to as an absolute magnitude sum constraint. The FIR filter may be implemented with the scaled coefficients and may generate scaled output sample y'(n), which may be expressed as:

$$y'(n) = b_0' \cdot x(n) + b_1' \cdot x(n-1) + b_2' \cdot x(n-2) = K_{FIR} \cdot y(n). \quad \text{Eq (6)}$$

In many cases, y'(n) may be used in place of y(n). However, in cases where signal level plays a non-trivial role (e.g., to avoid signal saturation), the $K_{FIR}$ scaling factor may be increased or decreased. Active devices such as amplifiers may be used to increase $K_{FIR}$. A switching pattern may be adjusted to reduce $K_{FIR}$.

Figure 2:
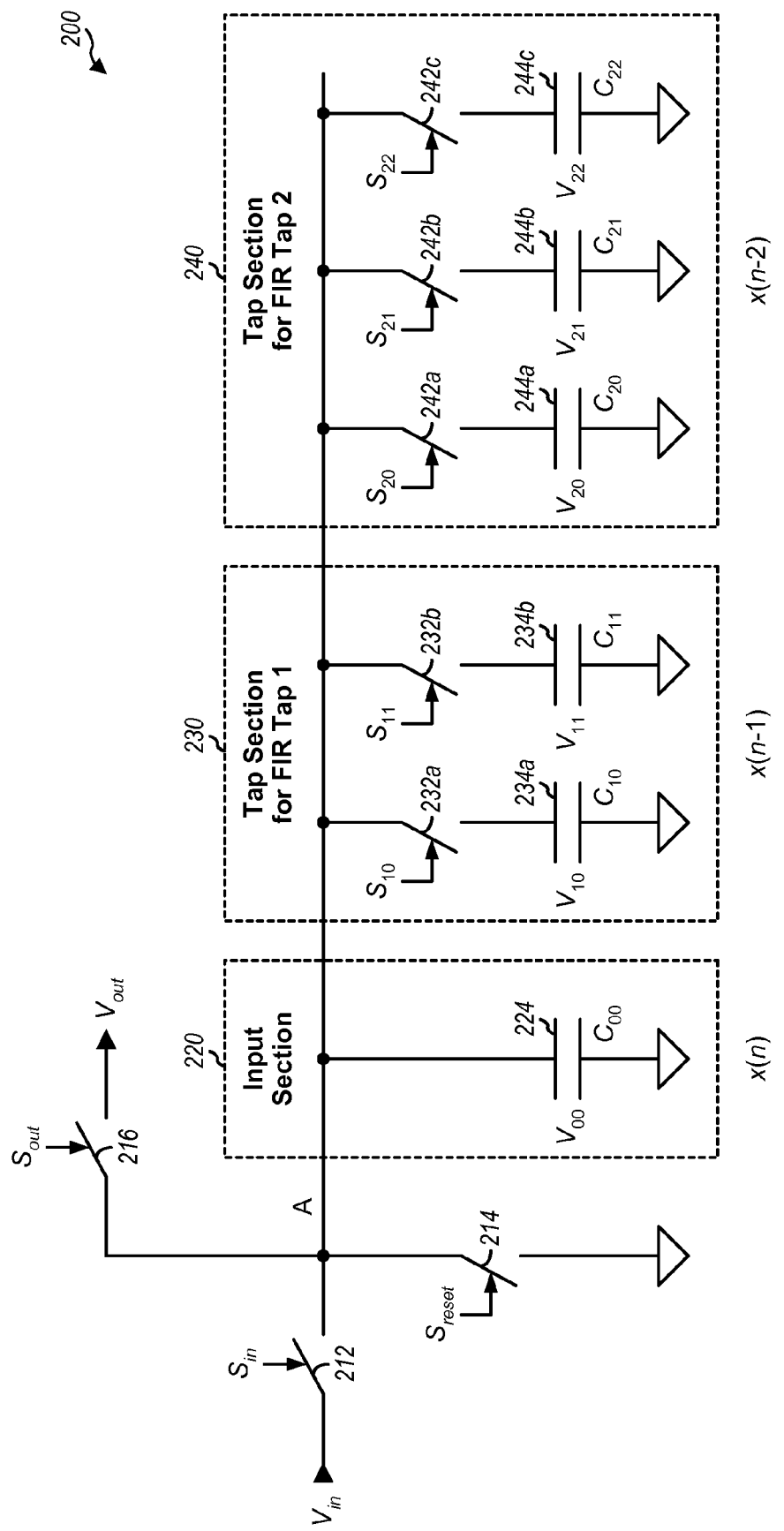
FIG. 2 shows a PSC filter that implements the second-order FIR filter.

FIG. 2 shows a schematic diagram of a design of a PSC filter 200 that implements second-order FIR filter 100 in FIG. 1. PSC filter 200 includes an input section 220 and two tap sections 230 and 240 for FIR taps 1 and 2, respectively, of FIR filter 100. Within PSC filter 200, an input switch 212 has one end receiving an input signal $V_{in}$ and the other end coupled to a summing node A. A reset switch 214 is coupled between the summing node and circuit ground. An output switch 216 has one end coupled to the summing node and the other end providing an output signal $V_{out}$. Switches 212, 214 and 216 may be implemented with metal oxide semiconductor (MOS) transistors or other types of transistors or switches.

Input section 220 includes an input capacitor 224 coupled between the summing node and circuit ground. Tap section 230 includes two switches 232a and 232b coupled in series with two capacitors 234a and 234b, respectively. Both series combinations of switch 232 and capacitor 234 are coupled between the summing node and circuit ground. Tap section 240 includes three switches 242a, 242b and 242c coupled in series with three capacitors 244a, 244b and 244c, respectively. All three series combinations of switch 242 and capacitor 244 are coupled between the summing node and circuit ground.

All capacitor(s) in each section have the same capacitance/size, which is determined by the corresponding filter coefficient. The capacitances of the capacitors in the three sections of PSC filter 200 may be given as:

$$C_{00} = K \cdot b_0', \quad \text{Eq (7a)}$$

$$C_{10} = C_{11} = K \cdot b_1', \text{ and} \quad \text{Eq (7b)}$$

$$C_{20} = C_{21} = C_{22} = K \cdot b_2', \quad \text{Eq (7c)}$$

where $C_{ij}$ is the capacitance of the j-th capacitor in the section for FIR tap i, and K is a scaling constant.

As shown in equation set (7), the size of each capacitor $C_{ij}$ is proportional to the corresponding scaled coefficient $b_i'$. K may be selected based on various factors such as switching settling time, capacitor size, power dissipation, noise, etc. A negative capacitor for a negative coefficient may be obtained by switching the polarity of the capacitor between a read phase and a charge sharing phase.

In each clock cycle, switch 212 is closed for a brief period of time to charge one capacitor in each section with the $V_{in}$ signal. The capacitor selected for charging in each tap section is determined by switches 232 and 242, as described below. The total input capacitance observed by the $V_{in}$ signal for the charge operation may be expressed as:

$$C_{in} = C_{00} + C_{1u} + C_{2v}, \quad \text{Eq (8)}$$

where $u \in \{0, 1\}$ is an index of the capacitor selected for charging in tap section 230, and v ∈ {0, 1, 2} is an index of the capacitor selected for charging in tap section 240.

Since the capacitors in each tap section have the same capacitance, the total input capacitance $C_{in}$ is constant for each clock cycle.

In each clock cycle, an appropriate capacitor in each tap section is used to generate the $V_{out}$ signal. For FIR tap L, the capacitor charged L clock cycles earlier and storing x(n−L) is selected for use via its associated switch. The two selected capacitors in tap sections 230 and 240 and input capacitor 224 are used in a charge sharing operation that implements the multiplications with filter coefficients $b_0'$ through $b_2'$ and the summing of the multiplier outputs in equation (6).

The charge sharing operation uses capacitor size to achieve multiplication with a filter coefficient and current summing to achieve summing of the multiplier outputs. For each capacitor within PSC filter 200, the voltage $V_{ij}$ across that capacitor is determined by the $V_{in}$ signal at the time the capacitor is charged, or $V_{ij}=V_{in}$. The electrical charge $Q_{ij}$ stored by each capacitor is determined by the voltage $V_{ij}$ across that capacitor and the capacitance $C_{ij}$ of the capacitor, or $Q_{ij}=V_{ij} \cdot C_{ij}$. In each clock cycle, one capacitor storing the proper sample x(n−i) from each tap section is selected, and the charges from all selected capacitors as well as input capacitor 224 are shared. The charge sharing for the FIR filter may be expressed as:

$$V_{out} = \frac{C_{00} \cdot V_{00} + C_{1p} \cdot V_{1p} + C_{2q} \cdot V_{2q}}{C_{00} + C_{1p} + C_{2q}}, \quad \text{Eq (9)}$$

where p ∈ {0, 1} is an index of the capacitor storing x(n−1) in tap section 230, and q ∈ {0, 1, 2} is an index of the capacitor storing x(n−2) in tap section 240.

Since the capacitors in each tap section have the same capacitance, the total output capacitance $C_{out}$ observed by the $V_{out}$ signal is constant for each clock cycle and is equal to the total input capacitance, or $C_{out}=C_{in}$.

Index p can cycle between 0 and 1, so that in each clock cycle one capacitor 234 in tap section 230 is charged, and the other capacitor 234 is used for charge sharing. Index q can cycle from 0 through 2, so that in each clock cycle one capacitor 244 in tap section 240 is charged, and another capacitor 244 is used for charge sharing. PSC filter 200 may be considered as having six states for the six different (p, q) combinations.

Figure 3:
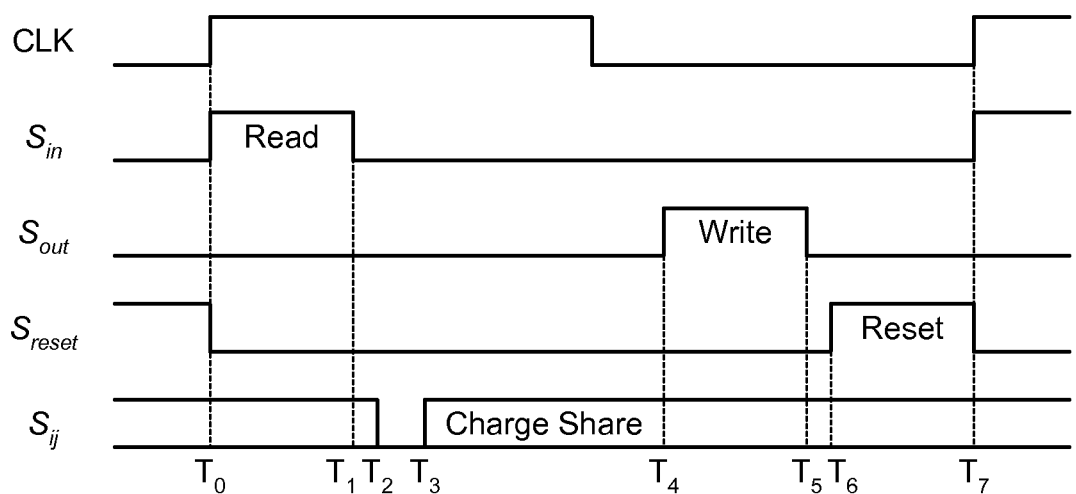
FIG. 3 shows a timing diagram for the PSC filter in FIG. 2.

FIG. 3 shows a timing diagram of various control signals for PSC filter 200 in FIG. 2. A clock signal CLK is shown at the top of the timing diagram. Control signals for the switches within PSC filter 200 are shown below the clock signal.

In the design shown in FIG. 3, each clock cycle includes a read/charge phase, a compute/charge sharing phase, a write/output phase, and a reset/discharge phase. For the read phase from time $T_0$ to time $T_1$, the $S_{in}$ control signal is asserted, switch 212 is closed, and input capacitor $C_{00}$ and one capacitor in each tap section are charged with the $V_{in}$ signal. The $S_{ij}$ control signal for each capacitor selected for charging is asserted during the read phase and de-asserted at time $T_2$. For the charge sharing phase starting at time $T_3$, the $S_{ij}$ control signal for each capacitor selected for charge sharing is asserted, and the selected capacitors in sections 230 and 240 as well as capacitor $C_{00}$ perform charge sharing via the summing node. For the write phase from time $T_4$ to time $T_5$, the $S_{out}$ control signal is asserted, switch 216 is closed, and the voltage at the summing node is provided as the $V_{out}$ signal.

For the reset phase from time $T_6$ to time $T_7$, the $S_{reset}$ control signal is asserted, switch 214 is closed, and the capacitors used for charge sharing are reset/discharged. These capacitors may be charged with the $V_{in}$ signal in the next clock cycle.

Figure 4:
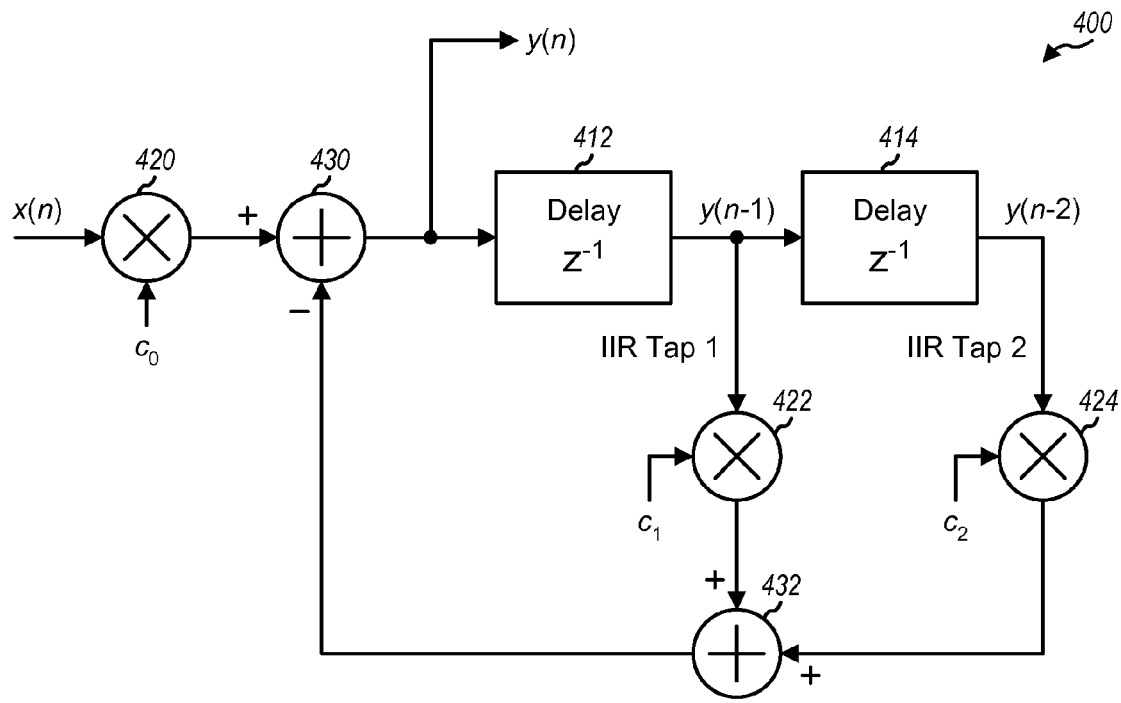
FIG. 4 shows a block diagram of a second-order IIR filter.

FIG. 4 shows a block diagram of a second-order IIR filter 400 that may be implemented with a PSC filter. Within IIR filter 400, a multiplier 420 receives and scales an input sample x(n) with a filter coefficient $c_0$. A summer 430 subtracts the output of a summer 432 from the output of multiplier 420 and provides an output sample y(n).

Two delay elements 412 and 414 are coupled in series, with each delay element providing a delay of one clock cycle. Delay element 412 receives the output sample y(n) and provides a delayed sample y(n−1). Delay element 414 receives delayed sample y(n−1) and provides a delayed sample y(n−2). IIR filter 400 includes two IIR taps 1 and 2 for second order. A multiplier 422 for IIR tap 1 is coupled to the output of delay element 412. A multiplier 424 for IIR tap 2 is coupled to the output of delay element 414. Multipliers 422 and 424 multiply their samples with filter coefficients $c_1$ and $c_2$, respectively, for the two IIR taps. Summer 432 sums the outputs of multipliers 422 and 424 and provides its output to summer 430.

The output sample y(n) from IIR filter 400 may be expressed as:

$$y(n)=c_0 \cdot x(n)-c_1 \cdot y(n-1)-c_2 \cdot y(n-2). \quad \text{Eq (10)}$$

A transfer function $H_{IIR}(z)$ for IIR filter 400 may be expressed as:

$$H_{IIR}(z) = \frac{c_0}{1 + c_1 \cdot z^{-1} + c_2 \cdot z^{-2}}. \quad \text{Eq (11)}$$

Figure 5:
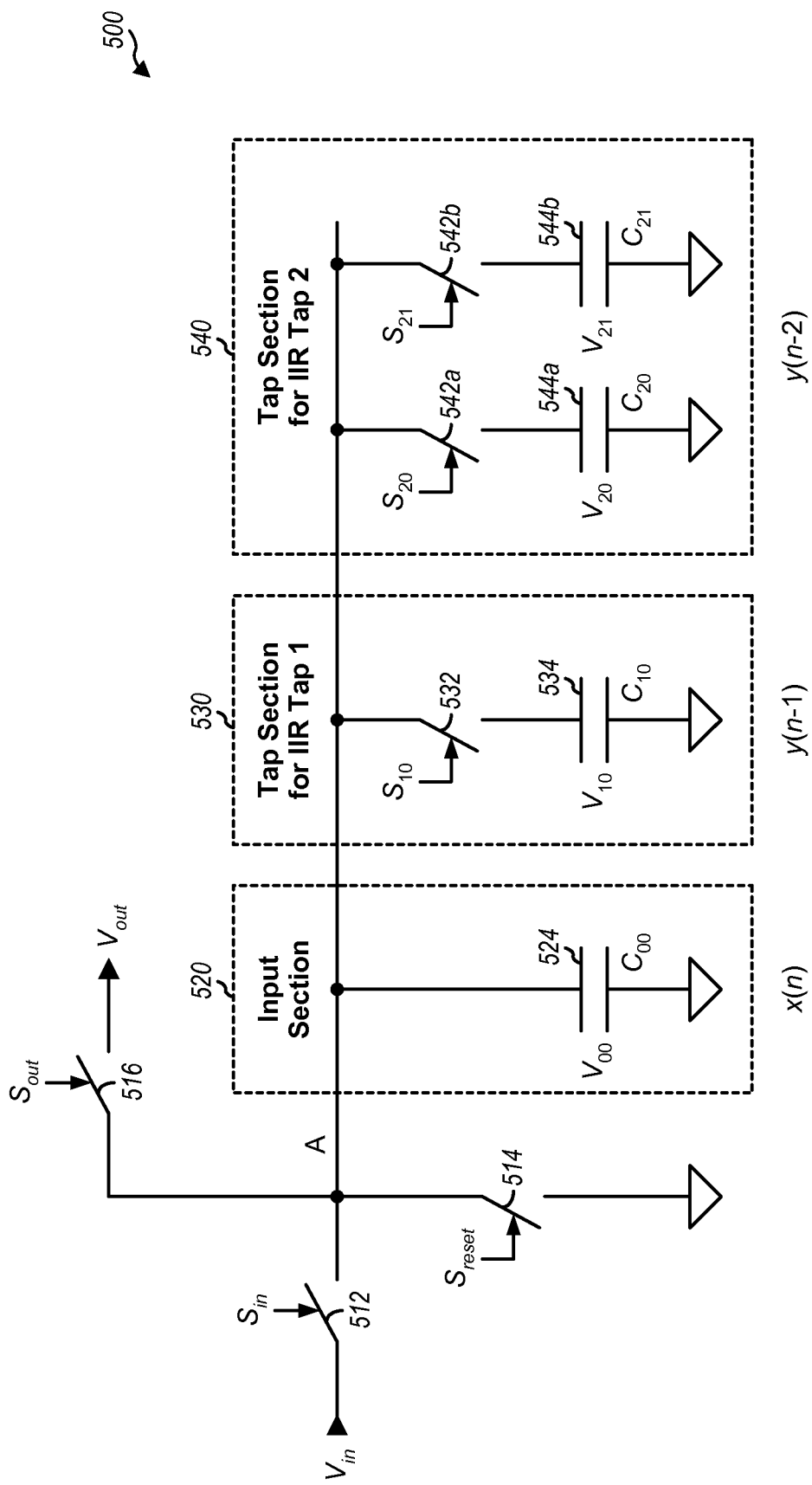
FIG. 5 shows a PSC filter that implements the second-order IIR filter.

FIG. 5 shows a schematic diagram of a design of a PSC filter 500 that implements second-order IIR filter 400 in FIG. 4. PSC filter 500 includes an input section 520 and two tap sections 530 and 540 for IIR taps 1 and 2, respectively, of IIR filter 400. Within PSC filter 500, an input switch 512 has one end receiving an input signal $V_{in}$ and the other end coupled to a summing node A. A reset switch 514 is coupled between the summing node and circuit ground. An output switch 516 has one end coupled to the summing node and the other end providing an output signal $V_{out}$.

Input section 520 includes a capacitor 524 coupled between the summing node and circuit ground. Tap section 530 includes a switch 532 coupled in series with a capacitor 534, the combination of which is coupled between the summing node and circuit ground. Tap section 540 includes two switches 542a and 542b coupled in series with two capacitors 544a and 544b, respectively. Both series combinations of switch 542 and capacitor 544 are coupled between the summing node and circuit ground. Capacitors 534 and 544 in tap sections 530 and 540 may be reset at the start of filtering operation.

All capacitor(s) in each section of PSC filter 500 have the same capacitance, which is determined by the corresponding filter coefficient. The capacitances of the capacitors in the three sections of PSC filter 500 may be given as:

$$C_{00}=K \cdot c_0, \quad \text{Eq (12a)}$$

$$C_{10}=K \cdot c_1, \text{ and} \quad \text{Eq (12b)}$$

$$C_{20}=C_{21}=K \cdot c_2. \quad \text{Eq (12c)}$$

As shown in equation set (12), the size of each capacitor $C_{ij}$ is proportional to the magnitude of the corresponding filter coefficient $c_i$. A negative capacitor for a negative coefficient may be obtained by switching the polarity of the capacitor between the read phase and the charge sharing phase.

In each clock cycle, switch 512 is closed for a brief period of time to charge capacitor 524 in section 520 with the $V_{in}$ signal. The total input capacitance observed by the $V_{in}$ signal is thus $C_{in}=C_{00}$, and no extra capacitors are needed for $C_{in}$.

In each clock cycle, an appropriate capacitor in each tap section is used to generate the $V_{out}$ signal. For IIR tap L, the capacitor charged L clock cycles earlier and storing y(n−L) is selected for use via its associated switch. Two selected capacitors in tap sections 530 and 540 as well as input capacitor 524 are used in a charge sharing operation that implements the multiplications with filter coefficients $c_0$ through $c_2$ and the summing of the multiplier outputs in equation (10). The charge sharing for the IIR filter may be expressed as:

$$V_{out} = \frac{C_{00} \cdot V_{00} + C_{10} \cdot V_{10} + C_{2k} \cdot V_{2k}}{C_{00} + C_{10} + C_{2k}}, \quad \text{Eq (13)}$$

where $k \in \{0, 1\}$ is an index of the capacitor storing y(n−2) in tap section 540.

After completing the charge sharing, the voltage across capacitors $C_{00}$, $C_{10}$ and $C_{2k}$ corresponds to y(n). Capacitors $C_{10}$ and $C_{2k}$ may store y(n) for use in subsequent clock cycles. Capacitor $C_{00}$ may provide y(n) for the $V_{out}$ signal. The total output capacitance observed by the $V_{out}$ signal is $C_{out}=C_{00}$, and no extra capacitors are needed for $C_{out}$.

Index k can cycle between 0 and 1, so that each capacitor 544 in tap section 540 is used for charge sharing in alternating clock cycle. PSC filter 500 may be considered as having two states for the two possible values of k.

Figure 6:
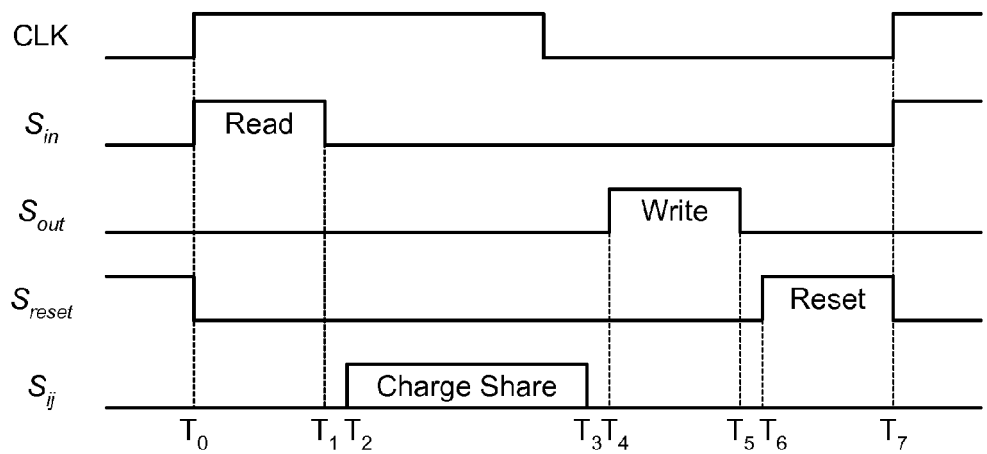
FIG. 6 shows a timing diagram for the PSC filter in FIG. 5.

FIG. 6 shows a timing diagram of various control signals for PSC filter 500 in FIG. 5. The clock signal CLK is shown at the top of the timing diagram. Control signals for the switches within PSC filter 500 are shown below the clock signal.

In the design shown in FIG. 6, each clock cycle includes a read phase, a charge sharing phase, a write phase, and a reset phase. For the read phase from time $T_0$ to time $T_1$, the $S_{in}$ control signal is asserted, switch 512 is closed, and input capacitor $C_{00}$ is charged with the $V_{in}$ signal. For the charge sharing phase from time $T_2$ to time $T_3$, the $S_{ij}$ control signal for each capacitor selected for charge sharing is asserted, and the selected capacitors as well as input capacitor $C_{00}$ perform charge sharing via the summing node. At the end of the charge sharing phase, the $S_{ij}$ control signal for each selected capacitor is de-asserted at time $T_3$, which then causes that capacitor to store y(n). For the write phase from time $T_4$ to time $T_5$, the $S_{out}$ control signal is asserted, switch 516 is closed, and capacitor $C_{00}$ provides y(n) to the $V_{out}$ signal. For the reset phase from time $T_6$ to time $T_7$, the $S_{reset}$ control signal is asserted, switch 514 is closed, and capacitor $C_{00}$ is reset.

The coefficients for the second-order IIR filter may be defined to meet the following power constraint for IIR filter:

$$|c_0|+|c_1|+|c_2|=1. \quad \text{Eq (14)}$$

If coefficients $c_0$, $c_1$ and $c_2$ do not meet the power constraint in equation (14), then several schemes may be used meet the power constraint.

In a first scheme for meeting the power constraint for IIR filter, if $|c_1|+|c_2|<1$, then a scaled coefficient $c_0'$ may be computed as follows:

$$c_0'=1-|c_1|-|c_2|. \quad \text{Eq (15)}$$

The coefficients $c_0'$, $c_1$ and $c_2$ meet the power constraint for IIR filter, as follows:

$$|c_0'|+|c_1|+|c_2|=1. \quad \text{Eq (16)}$$

The IIR filter may be implemented with coefficients $c_0'$, $c_1$ and $c_2$ and may generate output sample y'(n), which may be expressed as:

$$y'(n)=c_0' \cdot x(n) - c_1 \cdot y(n-1) - c_2 \cdot y(n-2). \quad \text{Eq (17)}$$

The transfer function with coefficients $c_0'$, $c_1$ and $c_2$ may be expressed as:

$$H'_{IIR}(z) = \frac{c_0'}{c_0} \cdot H_{IIR}(z) = \frac{1-|c_1|-|c_2|}{c_0} \cdot H_{IIR}(z). \quad \text{Eq (18)}$$

Figure 7:
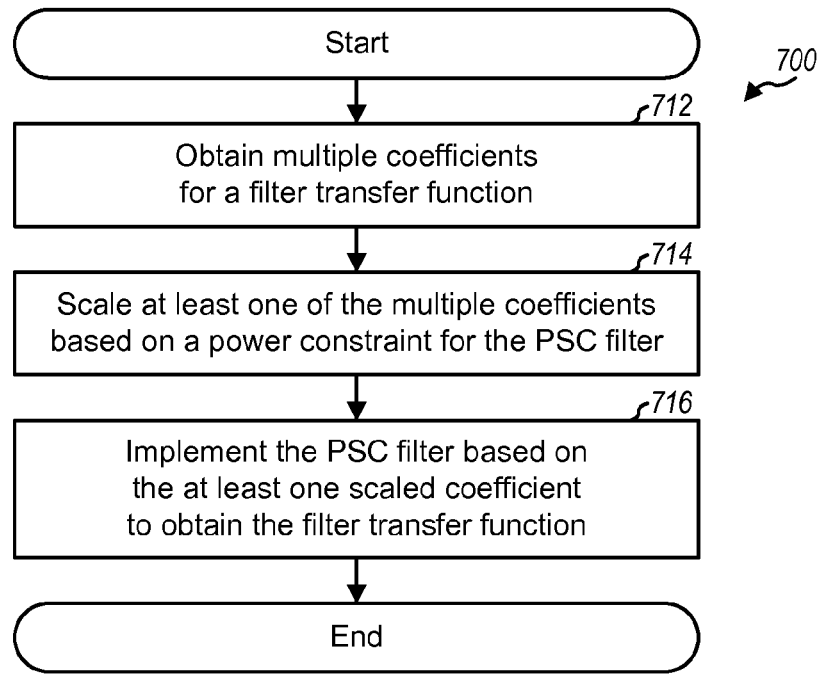
FIG. 7 shows a process for designing a PSC filter with coefficient scaling.

FIG. 7 shows a process 700 for designing a PSC filter with coefficient scaling to meet the power constraint. Multiple coefficients for a filter transfer function may be obtained (block 712). At least one of the multiple coefficients may be scaled based on a power constraint for the PSC filter (block 714). The PSC filter may then be implemented based on the at least one scaled coefficient to obtain the filter transfer function (block 716).

In one design, the filter transfer function may be for a FIR filter, e.g., a second-order FIR filter having the power constraint shown in equation (3). In this design, a scaling factor $K_{FIR}$ may be determined based on the magnitude of each of the multiple coefficients, e.g., as shown in equation (4d). Each of the multiple coefficients may then be scaled based on the scaling factor to obtain a corresponding scaled coefficient, e.g., as shown in equations (4a) through (4c).

In another design, the filter transfer function may be for an IIR filter, e.g., a second-order IIR filter having the power constraint shown in equation (14). In this design, one of the multiple coefficients may be replaced with a new coefficient determined based on magnitude of each remaining coefficient, e.g., as shown in equation (15).

In a second scheme for meeting the power constraint for IIR filter, if $|c_1|+|c_2| \geq 1$, then the second-order IIR filter may be decomposed into two first-order IIR sections. Lower-order IIR sections often (but not always) result in smaller coefficients, which may allow the power constraint to be met.

The decomposition of a second-order FIR section may be expressed as:

$$\begin{aligned}1+c_1 \cdot z^{-1} + c_2 \cdot z^{-2} &= (1-p \cdot z^{-1}) \cdot (1-p^* \cdot z^{-1}) \\ &= (1-(p_{re}+jp_{im}) \cdot z^{-1}) \cdot \\ &\quad (1-(p_{re}-jp_{im}) \cdot z^{-1})\end{aligned} \quad \text{Eq (19)}$$

where $p = p_{re} + j\, p_{im}$ is a complex coefficient, $c_1 = -2p_{re}$, $c_2 = p_{re}^2 + p_{im}^2$, and "*" denotes a complex conjugate.

As shown in equation (19), the decomposition of a second-order FIR section typically produces two complex first-order FIR sections with conjugated coefficients p and p*.

The complex coefficient may be tested for the following power constraint condition:

$$|p_{re}|+|p_{im}|<1. \quad \text{Eq (20)}$$

If the condition in equation (20) is satisfied, then the second-order IIR filter in equation (10) may be implemented with two concatenated complex first-order IIR sections, both of which meet the power constraint. A complex output sample $y'(n)$ from the first complex first-order IIR section may be expressed as:

$$y_{re}'(n)=\tilde{c}_0 \cdot x_{re}(n)+p_{re} \cdot y_{re}'(n-1)-p_{im} \cdot y_{im}'(n-1), \text{ and} \quad \text{Eq (21a)}$$

$$y_{im}'(n)=\tilde{c}_0 \cdot x_{im}(n)+p_{re} \cdot y_{im}'(n-1)+p_{im} \cdot y_{re}'(n-1), \quad \text{Eq (21b)}$$

where $x(n)=x_{re}(n)+j\, x_{im}(n)$ is a complex input sample,
$y'(n)=y_{re}'(n)+j\, y_{im}'(n)$ is a complex output sample from the first section, and
$\tilde{c}_0$ is a scaled coefficient that may be given as:

$$\tilde{c}_0=1-|p_{re}|-|p_{im}|. \quad \text{Eq (22)}$$

A complex output sample $y''(n)$ from the second complex first-order IIR section may be expressed as:

$$y_{re}''(n)=\tilde{c}_0 \cdot y_{re}'(n)+p_{re} \cdot y_{re}''(n-1)+p_{im} \cdot y_{im}''(n-1), \text{ and} \quad \text{Eq (23a)}$$

$$y_{im}''(n)=\tilde{c}_0 \cdot y_{im}'(n)+p_{re} \cdot y_{im}''(n-1)-p_{im} \cdot y_{re}''(n-1), \quad \text{Eq (23b)}$$

where $y''(n)=y_{re}''(n)+j\, y_{im}''(n)$ is a complex output sample from the second section.

As shown in equation sets (21) and (23), the first and second complex first-order IIR sections have the same coefficients. The only difference in the two complex first-order IIR sections is the sign of the samples scaled by $p_{im}$.

As an example, a second-order IIR filter may have coefficients $c_0=1$, $c_1=-0.25$ and $c_2=0.75$. Since $|c_1|+|c_2|=1$, the first scheme for scaling coefficients does not apply. Using the second scheme, second-order IIR filter may be decomposed into two complex first-order IIR sections with $p_{re}=0.125$, $p_{im}=0.857$, and $\tilde{c}_0=0.018$. Since $|p_{re}|+|p_{im}|<1$, the two complex first-order IIR sections meet the power constraint.

Figure 8:
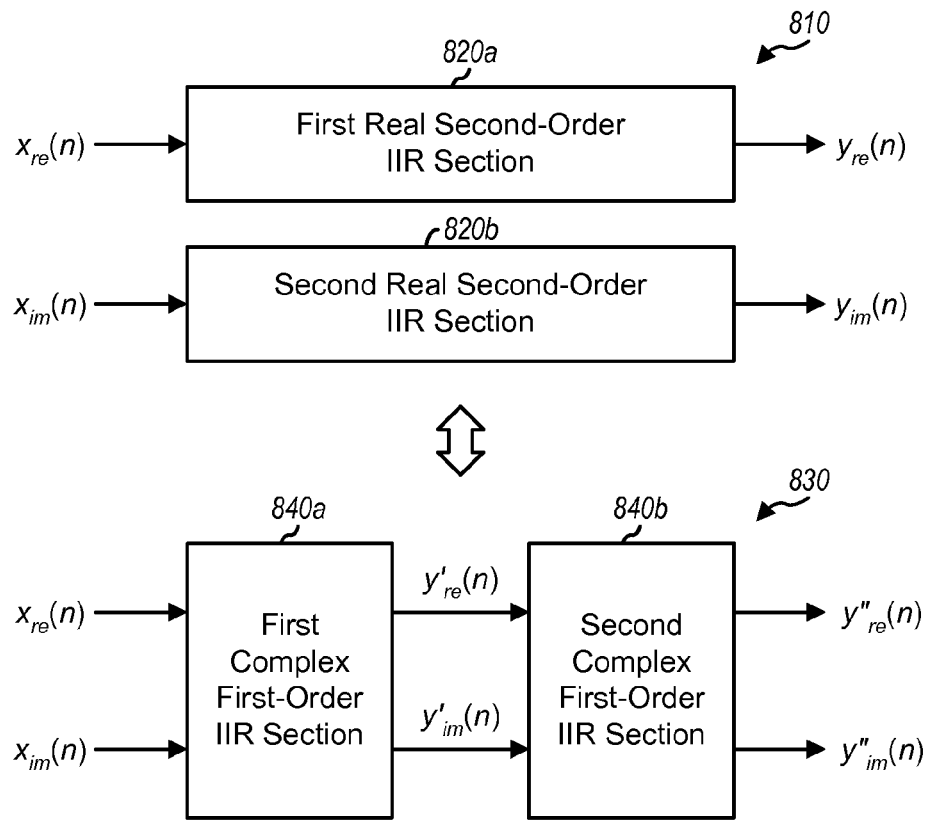
FIG. 8 shows filtering with complex second-order IIR filters.

FIG. 8 shows filtering of complex input samples with complex second-order IIR filters 810 and 830. For IIR filter 810, real input samples $x_{re}(n)$ may be filtered with a real second-order IIR filter 820a, e.g., as shown in equation (10), to obtain real output samples $y_{re}(n)$. Imaginary input samples $x_{im}(n)$ may be filtered with a real second-order IIR filter 820b to obtain imaginary output samples $y_{im}(n)$. IIR filters 820a and 820b independently filter the real and imaginary parts of the complex input samples. IIR filters 820a and 820b are identical and have the same coefficients. However, IIR filters 820a and 820b may not meet the power constraint and thus may not be directly implementable.

For IIR filter 830, the complex input samples $x_{re}(n)$ and $x_{im}(n)$ may be filtered with a complex first-order IIR section 840a, e.g., as shown in equation set (21), to obtain complex filtered samples $y_{re}'(n)$ and $y_{im}'(n)$. The complex filtered samples may be further filtered with a complex first-order IIR section 840b, e.g., as shown in equation set (23), to obtain complex output samples $y_{re}''(n)$ and $y_{im}''(n)$.

IIR filter 810 composed of two real second-order IIR filters 820a and 820b for the real and imaginary parts is equivalent to IIR filter 830 composed of two complex first-order IIR sections 840a and 840b. The complex output samples $y_{re}''(n)$ and $y_{im}''(n)$ from IIR filter 830 are equivalent to the complex output samples $y_{re}(n)$ and $y_{im}(n)$ from IIR filter 810. However, complex first-order IIR sections 840a and 840b may be implementable whereas real second-order IIR filters 820a and 820b may not be implementable.

Figure 9:
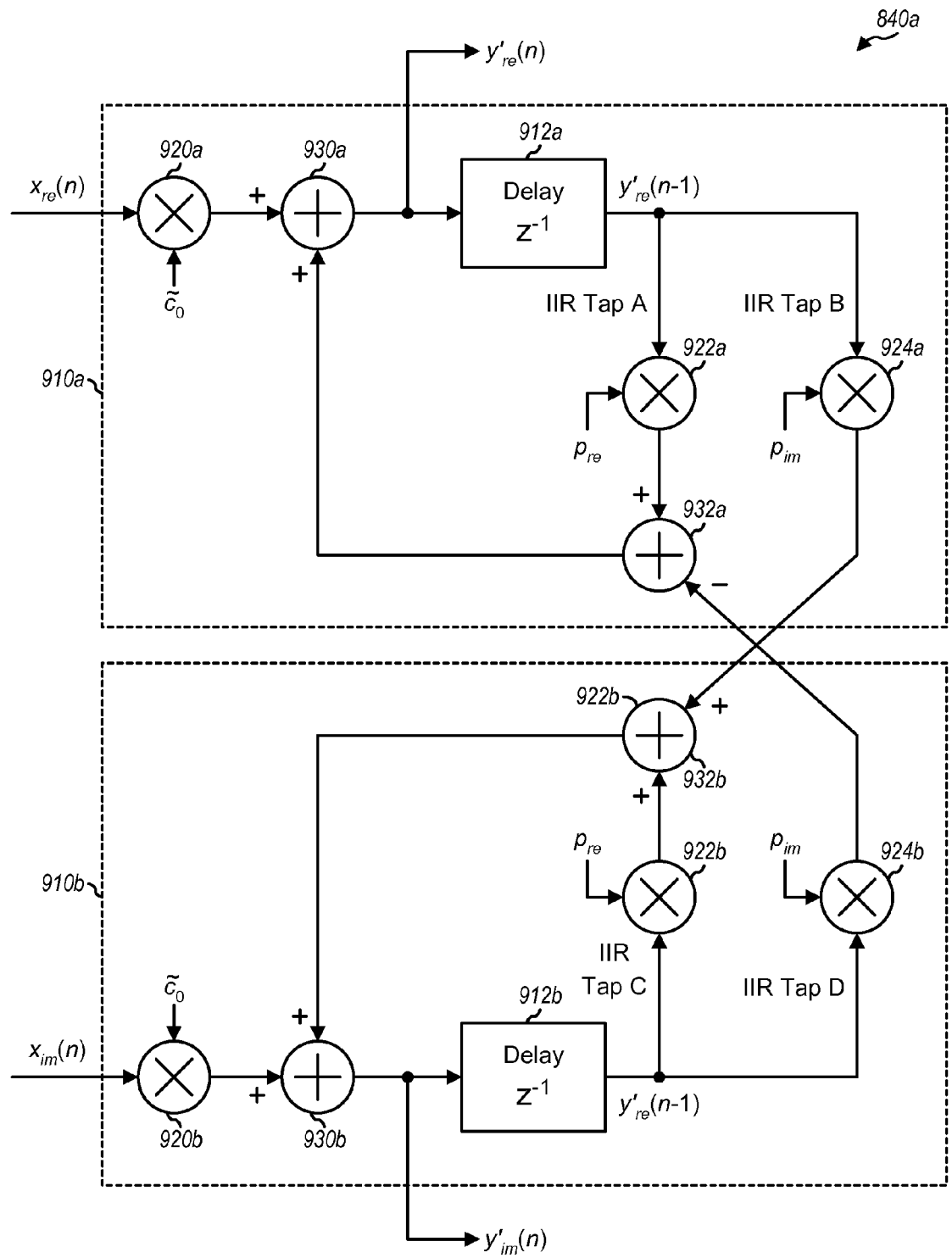
FIG. 9 shows a block diagram of a complex first-order IIR section.

FIG. 9 shows a block diagram of complex first-order IIR section 840a, which includes an IIR section 910a for the real part and an IIR section 910b for the imaginary part. Within IIR section 910a, a multiplier 920a receives and scales a real input sample $x_{re}(n)$ with filter coefficient $\tilde{c}_0$. A summer 930a sums the output of multiplier 920a with the output of a summer 932a and provides a real output sample $y_{re}'(n)$. A delay element 912a receives the real output sample $y_{re}'(n)$ and provides a real delayed sample $y_{re}'(n-1)$. A multiplier 922a for IIR tap A is coupled to the output of delay element 912a. A multiplier 924a for IIR tap B is also coupled to the output of delay element 912a. Multipliers 922a and 924a multiply the real delayed sample $y_{re}'(n-1)$ with filter coefficients $p_{re}$ and $p_{im}$, respectively, for IIR taps A and B. Summer 932a subtracts the output of a multiplier 924b in IIR section 910b from the output of multiplier 922a in IIR section 910a and provides its output to summer 930a.

IIR section 910b includes all of the elements in IIR section 910a. The elements in IIR section 910b are coupled in the same way as the elements in IIR section 910a with the following differences. A multiplier 922b for IIR tap C and a multiplier 924b for IIR tap D multiply the imaginary delayed sample $y_{im}'(n-1)$ from a delay element 912b with filter coefficients $p_{re}$ and $p_{im}$, respectively. A summer 932b sums the output of multiplier 924a in IIR section 910a with the output of multiplier 922b in IIR section 910b and provides its output to a summer 930b.

Complex first-order IIR section 840b in FIG. 8 may be implemented in similar manner as complex first-order IIR section 840a in FIG. 8, with the difference being a swamp in the signs of the outputs of multipliers 924a and 924b.

Figure 10:
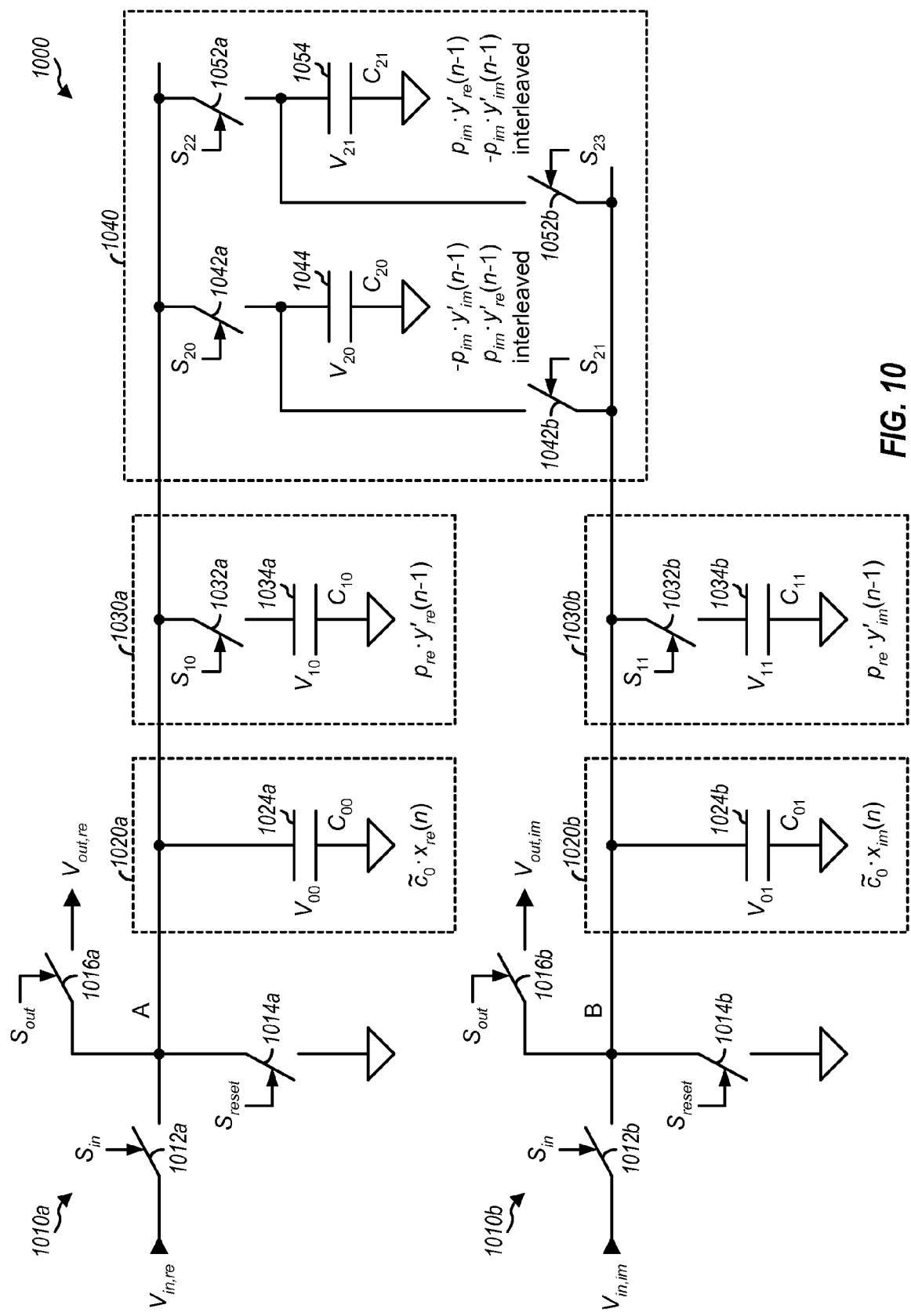
FIG. 10 shows a PSC filter that implements the complex first-order IIR section.

FIG. 10 shows a schematic diagram of a design of a PSC filter 1000 that implements complex first-order IIR section 840a in FIGS. 8 and 9. PSC filter 1000 includes a path 1010a for the real part and a path 1010b for the imaginary part. Path 1010a includes an input section 1020a and a tap section 1030a for IIR tap A of IIR section 840a in FIG. 9. Path 1010b includes an input section 1020b and a tap section 1030b for IIR tap C in FIG. 9. Both paths 1010a and 1010b share a tap section 1040 for IIR taps B and D in FIG. 9.

Within path 1010a, an input switch 1012a has one end receiving a real input signal $V_{in,re}$ and the other end coupled to a summing node A. A reset switch 1014a is coupled between summing node A and circuit ground. An output switch 1016a has one end coupled to summing node A and the other end providing a real output signal $V_{out,re}$. Switches 1012b, 1014b and 1016b in path 1010b are coupled in similar manner as switches 1012a, 1014a and 1016a, respectively, in path 1010a.

Input section 1020a includes a capacitor 1024a coupled between summing node A and circuit ground. Tap section 1030a includes a switch 1032a coupled in series with a capacitor 1034a, the combination of which is coupled between summing node A and circuit ground. Input section 1020b and tap section 1030b are coupled in similar manner between summing node B and circuit ground. Tap section 1040 includes two switches 1042a and 1052a having one end coupled to summing node A and the other end coupled to capacitors 1044 and 1054, respectively. Tap section 1040 further includes two switches 1042b and 1052b having one end coupled to summing node B and the other end coupled to capacitors 1044 and 1054, respectively. The other ends of capacitors 1044 and 1054 are coupled to circuit ground.

The capacitances of the capacitors in PSC filter 1000 may be given as:

$$C_{00}=C_{01}=K\cdot\tilde{c}_0, \quad \text{Eq (24a)}$$

$$C_{10}=C_{11}=K\cdot p_{re}, \text{ and} \quad \text{Eq (24b)}$$

$$C_{20}=C_{21}=K\cdot p_{im}. \quad \text{Eq (24c)}$$

For the example above with $p_{re}=0.125$, $p_{im}=0.857$, and $\tilde{c}_0=0.018$, the capacitance ratios may be given as follows:

$$C_{00}:C_{10};\ C_{10}:C_{11};\ C_{20}:C_{21} = \tilde{c}_0:\tilde{c}_0;\ p_{re}:p_{re};\ p_{im}:p_{im}$$

$$= 0.018{:}0.018;\ 0.125{:}0.125;$$

$$0.857{:}0.857$$

In each clock cycle, switches 1012a and 1012b are closed for a brief period of time to charge capacitor 1024a in section 1020a with the $V_{in,re}$ signal and to charge capacitor 1024b in section 1020b with the $V_{in,im}$ signal. In each clock cycle, capacitor 1024a in section 1020a, capacitor 1034a in section 1030b, and either capacitor 1044 or 1054 in section 1040 are used in a charge sharing operation that implements the multiplications with filter coefficients $\tilde{c}_0$, $p_{re}$ and $p_{im}$ and the summing of the multiplier outputs in equation (21a). In each clock cycle, capacitor 1024b in section 1020b, capacitor 1034b in section 1030b, and either capacitor 1054 or 1044 in section 1040 are used in a charge sharing operation that implements equation (21b). The charge sharing for the real and imaginary parts may be expressed as:

$$V_{out,re} = \frac{C_{00} \cdot V_{00} + C_{10} \cdot V_{10} + C_{2k} \cdot V_{2k}}{C_{00} + C_{10} + C_{2k}}, \text{ and} \quad \text{Eq (25a)}$$

$$V_{out,im} = \frac{C_{01} \cdot V_{01} + C_{11} \cdot V_{11} + C_{2\overline{k}} \cdot V_{2\overline{k}}}{C_{01} + C_{11} + C_{2\overline{k}}}, \quad \text{Eq (25b)}$$

where $k \in \{0, 1\}$ is an index of the capacitor storing $y_{im}'(n-1)$ in tap section 1040, and $\overline{k}$ is an index of the capacitor storing $y_{re}'(n-1)$ in tap section 1040.

After completing the charge sharing, the voltage on summing node A corresponds to $y_{re}'(n)$, and the voltage on summing node B corresponds to $y_{im}'(n)$. Capacitor 1024a may provide $y_{re}'(n)$ for the $V_{out,re}$ signal, and capacitor 1024b may provide $y_{im}'(n)$ for the $V_{out,im}$ signal. Capacitors 1034a may store $y_{re}'(n)$ and capacitor 1034b may store $y_{im}'(n)$ for use in the next clock cycle. Capacitors 1044 and 1054 are used in an interleaved manner to store $y_{re}'(n)$ and $y_{im}'(n)$ in each clock cycle. In each even-numbered clock cycle, capacitor 1044 may be coupled to summing node A, perform charge sharing, and store the $y_{re}'(n)$, while capacitor 1054 may be coupled to summing node B, perform charge sharing, and store the $y_{im}'(n)$. In each odd-numbered clock cycle, capacitor 1044 may be coupled to summing node B, perform charge sharing, and store the $y_{im}'(n)$, while capacitor 1054 may be coupled to summing node A, perform charge sharing, and store the $y_{re}'(n)$. Capacitor 1044 may thus be coupled to summing nodes A and B in alternating clock cycles, and capacitor 1054 may be coupled to summing nodes B and A in alternating clock cycles. Capacitors 1044 and 1054 have the same size but are interleaved in time.

FIG. 6 shows a timing diagram that may be used for the various control signals for PSC filter 1000 in FIG. 10. For the read phase from time $T_0$ to time $T_1$, the $S_{in}$ control signal is asserted, switches 1012a and 1012b are closed, capacitor $C_{00}$ is charged with the $V_{in,re}$ signal, and capacitor $C_{01}$ is charged with the $V_{in,im}$ signal. For the charge sharing phase from time $T_2$ to time $T_3$, the $S_{10}$ control signal and either the $S_{20}$ or $S_{22}$ control signal are asserted, and capacitor $C_{00}$, capacitor $C_{10}$ and either capacitor $C_{20}$ or $C_{22}$ perform charge sharing via summing node A. Simultaneously, the $S_{11}$ control signal and either the $S_{21}$ or $S_{23}$ control signal are asserted, and capacitor $C_{01}$, capacitor $C_{11}$ and either capacitor $C_{20}$ or $C_{22}$ perform charge sharing via summing node B. At the end of the charge sharing phase, the $S_{ij}$ control signal for each selected capacitor is de-asserted at time $T_3$, which then causes that capacitor to store $y_{re}'(n)$ or $y_{im}'(n)$. For the write phase from time $T_4$ to time $T_5$, the $S_{out}$ control signal is asserted, switches 1016a and 1016b are closed, capacitor $C_{00}$ provides $y_{re}'(n)$ to the $V_{out,re}$ signal, and capacitor $C_{01}$ provides $y_{im}'(n)$ to the $V_{out,im}$ signal. For the reset phase from time $T_6$ to time $T_7$, the $S_{reset}$ control signal is asserted, switches 1014a and 1014b are closed, and capacitors $C_{00}$ and $C_{01}$ are reset.

Figure 11:
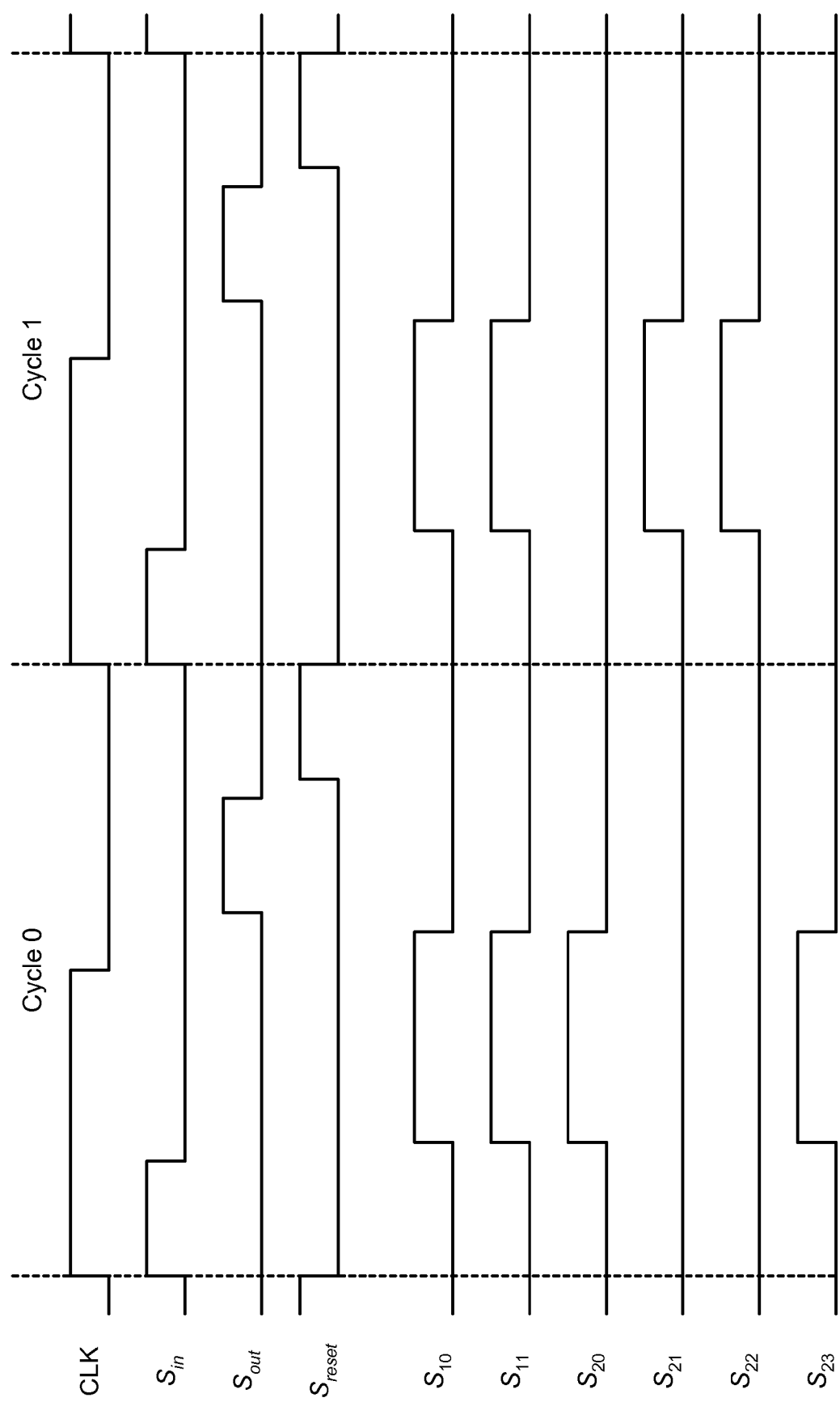
FIG. 11 shows a timing diagram for the PSC filter in FIG. 10.

FIG. 11 shows a timing diagram of a switching pattern for PSC filter 1000 in FIG. 10. The switching pattern includes two cycles 0 and 1 for the two possible values of k in equation set (25) and repeats every two clock cycles. Table 1 shows the two cycles 0 and 1 and, for each cycle, gives the capacitors used to generate the $V_{out,re}$ and $V_{out,im}$ signals.

TABLE 1

| Cycle k | Capacitors used to generate $V_{out,re}$ | Capacitors used to generate $V_{out,im}$ |
|---|---|---|
| 0 | $C_{00}$, $C_{10}$ and $C_{20}$ | $C_{01}$, $C_{11}$ and $C_{21}$ |
| 1 | $C_{00}$, $C_{10}$ and $C_{21}$ | $C_{01}$, $C_{11}$ and $C_{20}$ |

For cycle 0, input capacitor $C_{00}$ is charged with the $V_{in,re}$ signal and capacitor $C_{01}$ is charged with the $V_{in,im}$ signal when the $S_{in}$ control signal is asserted during the read phase. The $S_{10}$, $S_{11}$, $S_{20}$ and $S_{23}$ control signals are asserted during the charge sharing phase, capacitors $C_{00}$, $C_{10}$ and $C_{20}$ are used to generate the $V_{out,re}$ signal, and capacitors $C_{01}$, $C_{11}$ and $C_{21}$ are used to generate the $V_{out,im}$ signal. Capacitors $C_{10}$ and $C_{20}$ store the $V_{out,re}$ signal and capacitors $C_{11}$ and $C_{21}$ store the $V_{out,im}$ signal at the end of the charge sharing phase.

For cycle 1, input capacitor $C_{00}$ is charged with the $V_{in,re}$ signal and capacitor $C_{01}$ is charged with the $V_{in,im}$ signal during the read phase. The $S_{10}$, $S_{11}$, $S_{21}$ and $S_{22}$ control signals are asserted during the charge sharing phase, capacitors $C_{00}$, $C_{10}$ and $C_{21}$ are used to generate the $V_{out,re}$ signal, and capacitors $C_{01}$, $C_{11}$ and $C_{20}$ are used to generate the $V_{out,im}$ signal. Capacitors $C_{10}$ and $C_{21}$ store the $V_{out,re}$ signal and capacitors $C_{11}$ and $C_{20}$ store the $V_{out,im}$ signal at the end of the charge sharing phase.

For PSC filter 1000, capacitors $C_{00}$ and $C_{01}$ are charged with the $V_{in,re}$ and $V_{in,im}$ signals in each clock cycle and are also used for charge sharing in the same clock cycle. Capacitors $C_{10}$ and $C_{11}$ are used for charge sharing in each clock cycle and store $y_{re}'(n)$ and $y_{im}'(n)$ for use in the next clock cycle. For tap section 1040, index k toggles between 0 and 1, capacitors $C_{20}$ and $C_{21}$ are used for charge sharing at nodes A and B in one clock cycle, at nodes B and A in the following clock cycle, etc.

Table 2 summarizes the action performed by each capacitor in PSC filter 1000 in each clock cycle.

TABLE 2

| | Clock Cycle | | | |
|---|---|---|---|---|
| | n | n + 1 | n + 2 | ... |
| Capacitor $C_{00}$ | store $x_{re}(n)$ $x_{re}(n) \rightarrow y_{re}(n)$ | store $x_{re}(n+1)$ $x_{re}(n+1) \rightarrow y_{re}(n+1)$ | store $x_{re}(n+2)$ $x_{re}(n+2) \rightarrow y_{re}(n+2)$ | ... |
| Capacitor $C_{01}$ | store $x_{im}(n)$ $x_{im}(n) \rightarrow y_{im}(n)$ | store $x_{im}(n+1)$ $x_{im}(n+1) \rightarrow y_{im}(n+1)$ | store $x_{im}(n+2)$ $x_{im}(n+2) \rightarrow y_{im}(n+2)$ | ... |
| Capacitor $C_{10}$ | $y_{re}(n-1) \rightarrow y_{re}(n)$ store $y_{re}(n)$ | $y_{re}(n) \rightarrow y_{re}(n+1)$ store $y_{re}(n+1)$ | $y_{re}(n+1) \rightarrow y_{re}(n+2)$ store $y_{re}(n+2)$ | ... |
| Capacitor $C_{11}$ | $y_{im}(n-1) \rightarrow y_{im}(n)$ store $y_{im}(n)$ | $y_{im}(n) \rightarrow y_{im}(n+1)$ store $y_{im}(n+1)$ | $y_{im}(n+1) \rightarrow y_{im}(n+2)$ store $y_{im}(n+2)$ | ... |
| Capacitor $C_{20}$ | $y_{im}(n-1) \rightarrow y_{re}(n)$ store $y_{re}(n)$ | $y_{re}(n) \rightarrow y_{im}(n+1)$ store $y_{im}(n+1)$ | $y_{im}(n+1) \rightarrow y_{re}(n+2)$ store $y_{re}(n+2)$ | ... |
| Capacitor $C_{21}$ | $y_{re}(n-1) \rightarrow y_{im}(n)$ store $y_{im}(n)$ | $y_{im}(n) \rightarrow y_{re}(n+1)$ store $y_{re}(n+1)$ | $y_{re}(n+1) \rightarrow y_{im}(n+2)$ store $y_{im}(n+2)$ | ... |

Figure 12:
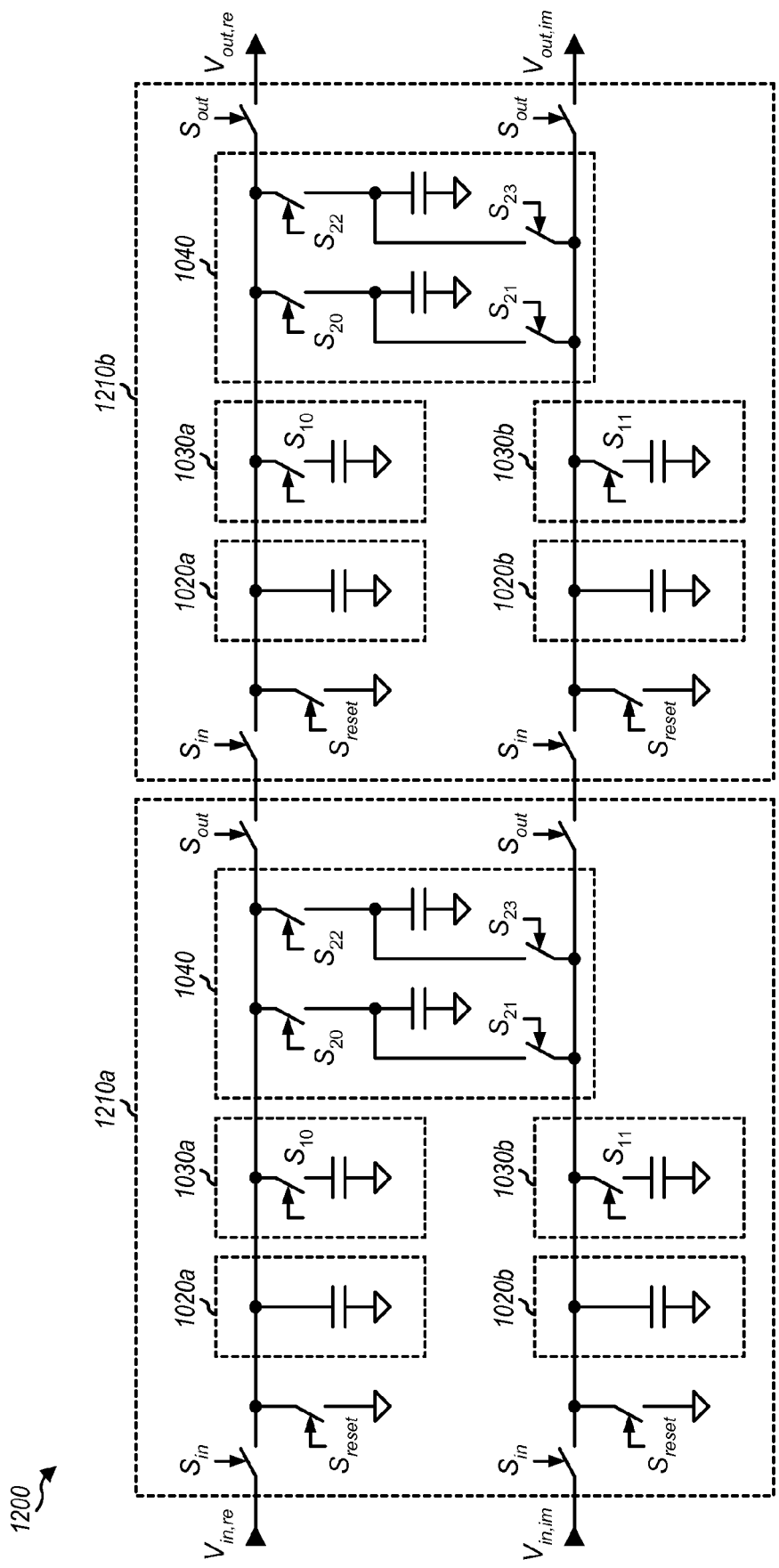
FIG. 12 shows a PSC filter that implements two complex first-order IIR sections.

FIG. 12 shows a schematic diagram of a design of a PSC filter 1200 that implements complex first-order IIR sections 840a and 840b in FIG. 8. PSC filter 1200 includes a first PSC filter section 1210a that implements complex first-order IIR section 840a and a second PSC filter section 1210b that implements complex first-order IIR section 840b. Each PSC filter section 1210 includes all elements in PSC filter 1000 in FIG. 10. The capacitors in tap section 1040 within PSC filter section 1210a are selected in different order than the capacitors in tap section 1040 within PSC filter section 1210b due to the difference between equation sets (21) and (23).

Figure 13:
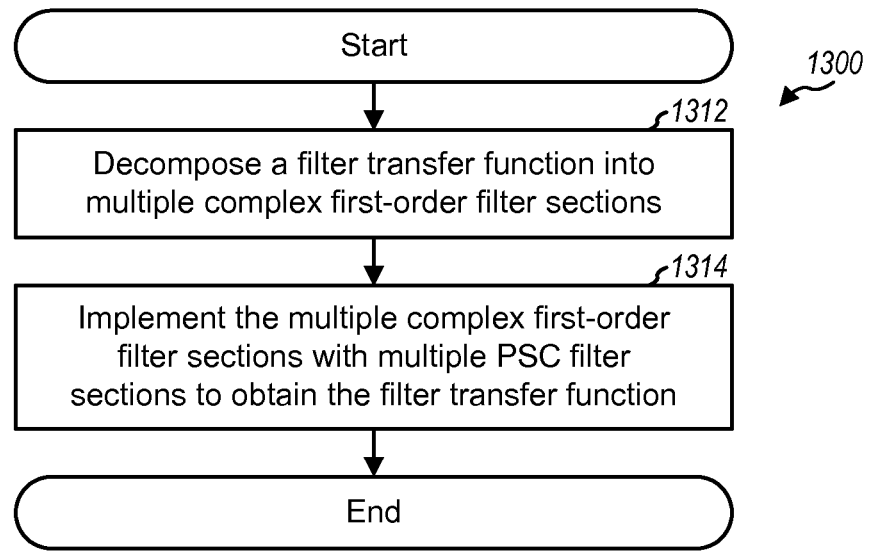
FIG. 13 shows a process for designing a PSC filter with decomposition.

FIG. 13 shows a process 1300 for designing a PSC filter with decomposition. A filter transfer function may be decomposed into multiple complex first-order filter sections, e.g., as shown in equation (19) (block 1312). In one design of block 1312, the filter transfer function is for a second-order IIR filter and may be decomposed into two complex first-order IIR sections. Complex coefficients (e.g., p and p*) for the two complex first-order IIR sections may be determined based on coefficients (e.g., $c_1$ and $c_2$) for the second-order IIR filter. An input coefficient (e.g., $\tilde{c}_0$) for the two complex first-order IIR sections may be determined based on the magnitude of the real and imaginary parts (e.g., $p_{re}$ and $p_{im}$) of the complex coefficients, e.g., as shown in equation (22). The multiple complex first-order filter sections may be implemented with multiple PSC filter sections to obtain the filter transfer function (block 1314).

The two complex first-order IIR sections obtained by decomposing a second-order IIR filter may not meet the power constraint. The complex pole obtained from the decomposition may be expressed as:

$$p = p_{re} + j p_{in} = r \cdot e^{j\theta}, \quad \text{Eq (26)}$$

where r is the magnitude of the pole and θ is the phase of the pole.

The sum of the magnitude of the real and imaginary parts of the pole may be expressed as:

$$|p_{re}| + |p_{im}| = r \cdot (|\cos\theta| + |\sin\theta|). \quad \text{Eq (27)}$$

A necessary and sufficient condition for stability of an IIR filter is r<1. The power constraint may be met with $|p_{re}| + |p_{im}|<1$. The term $(|\cos\theta|+|\sin\theta|)$ may be greater than one depending on the value of θ. Thus, it is possible to have $|p_{re}|+|p_{im}|\geq 1$ even with r<1, in which case the IIR filter is stable but not directly implementable.

In a third scheme for meeting the power constraint for IIR filter, which may be used when the complex first-order IIR sections do not meet the power constraint, a complex first-order IIR section may be implemented with an interleaved filter bank. From equation set (21), the complex filtered samples from complex first-order IIR section 840a may be expressed as:

$$y'(n) = \tilde{c}_0 \cdot x(n) + p \cdot y'(n-1) \quad \text{Eq (28)}$$
$$= \tilde{c}_0 \cdot x(n) + p \cdot \tilde{c}_0 \cdot x(n-1) + p^2 \cdot y'(n-2).$$

Two consecutive filtered samples from complex first-order IIR section 840a may be expressed as:

$$y'(n) = \tilde{c}_0 \cdot x(n) + p \cdot \tilde{c}_0 \cdot x(n-1) + p^2 \cdot y'(n-2), \text{ and} \quad \text{Eq (29a)}$$

$$y'(n+1) = \tilde{c}_0 \cdot x(n+1) + p \cdot \tilde{c}_0 \cdot x(n) + p^2 \cdot y'(n-1). \quad \text{Eq (29b)}$$

Equation set (29) may be partitioned into an IIR part and a FIR part. The IIR part may also be referred to as a recursive part or an autoregressive part. The FIR part may also be referred to as a non-recursive part. The IIR part may be expressed as:

$$y'(n) = \check{c}_0 \cdot \check{x}(n) + p^2 \cdot y'(n-2), \text{ and} \quad \text{Eq (30a)}$$

$$y'(n+1) = \check{c}_0 \cdot \check{x}(n+1) + p^2 \cdot y'(n-1), \quad \text{Eq (30b)}$$

where $\check{c}_0 = 1 - |\text{real}(p^2)| - |\text{imag}(p^2)|$ and $\check{x}(n)$ is the output of the FIR part.

The FIR part may be expressed as:

$$\check{x}(n) = \check{c}_0^{-1} \cdot \tilde{c}_0 \cdot x(n) + \check{c}_0^{-1} \cdot \tilde{c}_0 \cdot p \cdot x(n-1), \text{ and} \quad \text{Eq (31a)}$$

$$\check{x}(n+1) = \check{c}_0^{-1} \cdot \tilde{c}_0 \cdot x(n+1) + \check{c}_0^{-1} \cdot \tilde{c}_0 \cdot p \cdot x(n). \quad \text{Eq (31b)}$$

Figure 14:
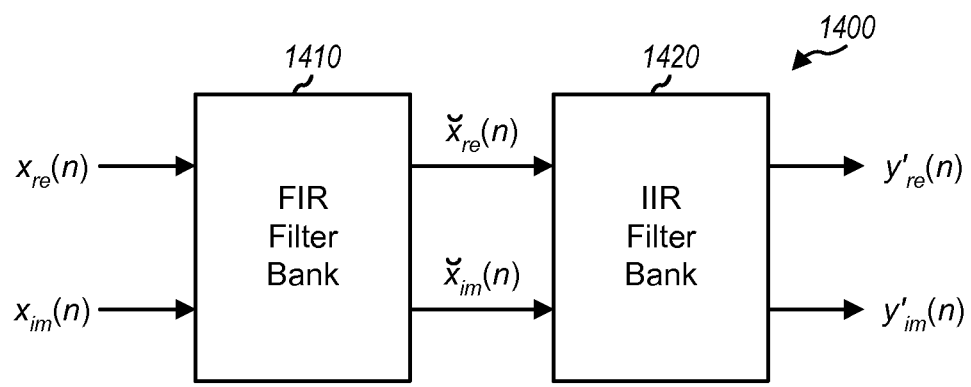
FIG. 14 shows a complex first-order IIR section implemented with a FIR filter bank and an IIR filter bank.

FIG. 14 shows a block diagram of a complex first-order IIR section 1400 implemented with a FIR filter bank 1410 and an IIR filter bank 1420. FIR filter bank 1410 may filter the complex input samples $x_{re}(n)$ and $x_{im}(n)$ as shown in equation set (31) and provide complex filtered samples $\check{x}_{re}(n)$ and $\check{x}_{im}(n)$. IIR filter bank 1420 may filter the complex filtered samples $\check{x}_{re}(n)$ and $\check{x}_{im}(n)$ as shown in equation set (30) and provide complex output samples $y_{re}'(n)$ and $y_{im}'(n)$. FIG. 14 shows a design with IIR filter bank 1420 being placed after FIR filter bank 1410. In another design, FIR filter bank 1410 may be placed after IIR filter bank 1420. The order of FIR filter bank 1410 and IIR filter bank 1420 may be selected based on noise and other considerations.

Figure 15:
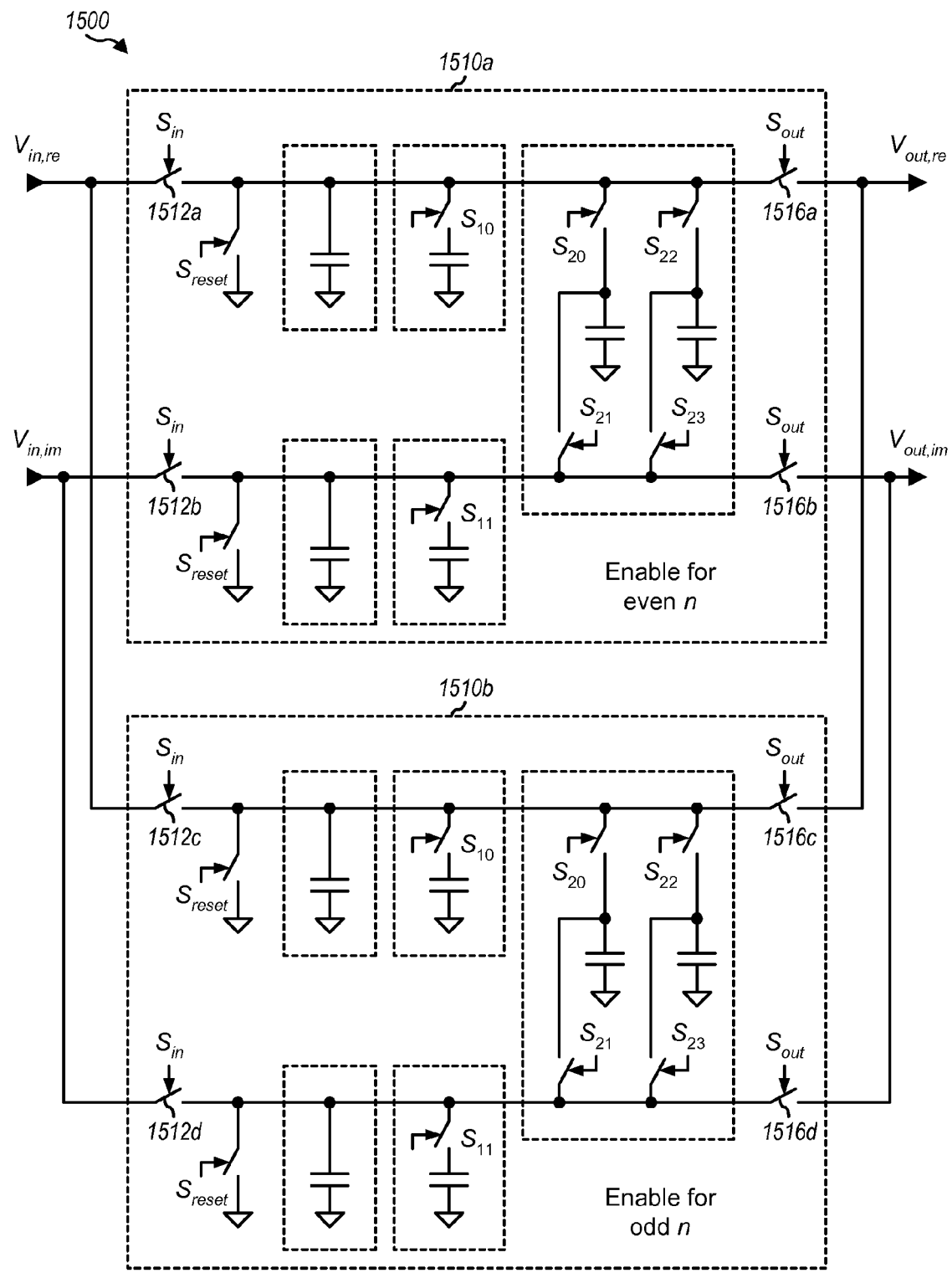
FIG. 15 shows a PSC filter that implements the IIR filter bank in FIG. 14.

FIG. 15 shows a schematic diagram of a design of a PSC filter 1500 that implements IIR filter bank 1420 in FIG. 14. PSC filter 1500 includes a first IIR section 1510a and a second IIR section 1510b. Each IIR section 1510 includes all elements of PSC filter 1000 in FIG. 10.

A real input signal $V_{in,re}$ is provided to both a switch 1512a in IIR section 1510a and a switch 1512c in IIR section 1510b. An imaginary input signal $V_{in,im}$ is provided to both a switch 1512b in IIR section 1510a and a switch 1512d in IIR section 1510b. A switch 1516a in IIR section 1510a and a switch 1516c in IIR section 1510b are coupled together and provide a real output signal $V_{out,re}$. A switch 1516b in IIR section 1510a and a switch 1516d in IIR section 1510b are coupled together and provide an imaginary output signal $V_{out,im}$. The other elements within IIR sections 1510a and 1510b are coupled as described above for FIG. 10.

IIR section 1510a operates in each even-numbered clock cycle, filters the $V_{in,re}$ and $V_{in,im}$ signals, and provides the $V_{out,re}$ and $V_{out,im}$ signals. IIR section 1510a is disabled during each odd-numbered clock cycle. Conversely, IIR section 1510b operates in each odd-numbered clock cycle, filters the $V_{in,re}$ and $V_{in,im}$ signals, and provides the $V_{out,re}$ and $V_{out,im}$ signals. IIR section 1510b is disabled during each even-numbered clock cycle. IIR sections 1510a and 1510b thus operate in an interleaved manner, with IIR section 1510a operating in one clock cycle, then IIR section 1510b operating in the next clock cycle, then IIR section 1510a operating in the following clock cycle, etc. IIR section 1510a operates on $\check{x}(n)$ and provides $y'(n)$, as shown in equation (30a). IIR section 1510b operates on $\check{x}(n+1)$ and provides $y'(n+1)$, as shown in equation (30b).

In one design, a PSC filter for FIR filter bank 1410 in FIG. 14 (which may be a FIR filter) may be implemented in similar manner as PSC filter 1000 in FIG. 10. However, the switches for the PSC filter for FIR filter bank 1410 are operated to implement a FIR filter instead of an IIR filter. In another design, two FIR filter banks may be merged from two first-order complex IIR filters. The merged second-order FIR filter has real coefficients and may be implemented as a normal second-order PSC FIR filter.

Equation sets (30) and (31) show filter bank transformation for a case in which IIR filter bank 1420 includes two IIR sections. In general, the filter bank transformation may be performed for any value of m or $M=2^m$ to obtain a complex pole at $p^{2^m}=p^M$. The IIR part may be expressed as:

$$y'(n+i)=\check{c}_0 \cdot \check{x}(n+i)+p^M \cdot y'(n-M+i), \text{ for } i=0,\ldots,M-1, \quad \text{Eq (32)}$$

$$\text{where } \check{c}_0=1-|\text{real}(p^M)|-|\text{imag}(p^M)|. \quad \text{Eq (33)}$$

A filter bank may thus include M IIR sections. Each IIR section may be implemented as shown in FIG. 15, may operate at 1/M of the clock rate, and may be enabled every M clock cycles. The M IIR sections may be sequentially enabled in M clock cycles, one IIR section in each clock cycle.

Figure 16:
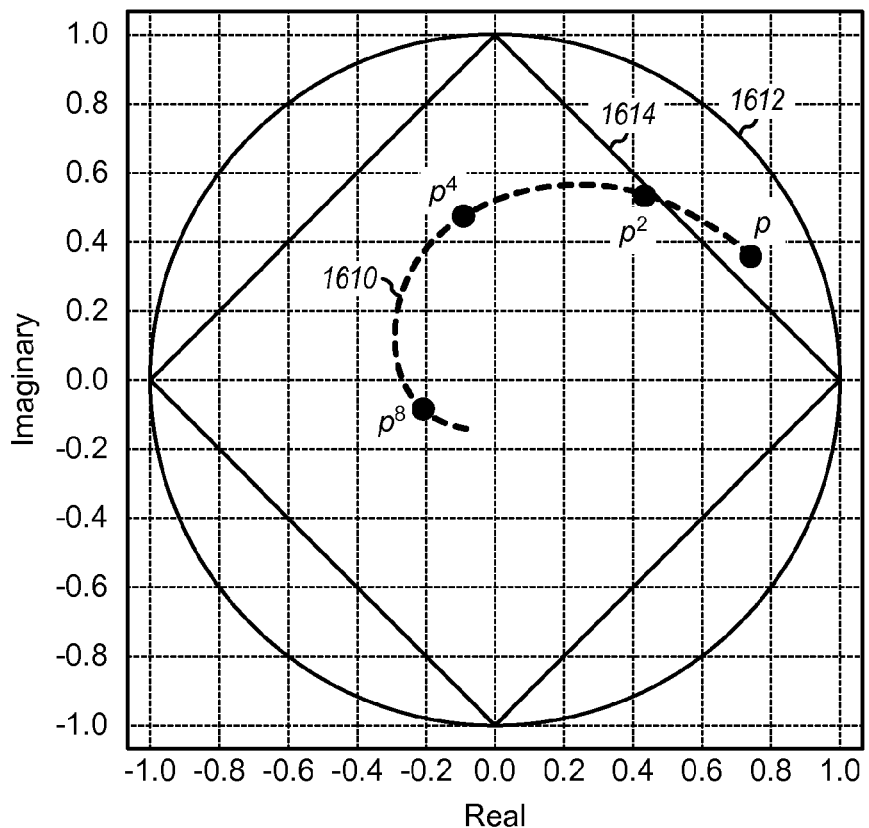
FIG. 16 shows a plot of pole movement due to filter bank transformation.

FIG. 16 shows a plot 1610 of pole movement due to filter bank transformation with different values of M. An IIR filter is stable if its pole has a magnitude of r<1 and is located within a unit circle 1612. The pole of the IIR filter meets the power constraint in equation (20) if it is located within a diamond box 1614. The filter bank transformation changes the pole from p to $p^M$. Plot 1610 shows the pole location for an example IIR filter with $c_0=1$, $c_1=-1.5$ and $c_2=0.6875$. In this example, the pole p obtained from decomposition is located outside diamond box 1614 and thus does not meet the power constraint. The filter bank transformation with M=2 results in the pole $p^2$ being located within diamond box 1614 and thus meets the power constraint. The filter bank transformation with M=4 and 8 results in the poles $p^4$ and $p^8$ being located closer to the origin. As shown by this example, the pole generally moves toward the origin for larger values of M. In general, a larger distance from the pole to the unit circle may result in smaller insertion loss, which is desirable.

The pole due to filter bank transformation with M=2 may be expressed as:

$$p^2=r^2 \cdot e^{j2\theta}=\check{p}=\check{p}_{re}+j\check{p}_{im}. \quad \text{Eq (34)}$$

The power constraint for the IIR part may then be expressed as:

$$|\check{p}_{re}|+|\check{p}_{im}|=r^2 \cdot (|\cos 2\theta|+|\sin 2\theta|) \leq 1. \quad \text{Eq (35)}$$

Since r<1 for a stable IIR filter, $r^2$<r and it may be more possible to meet the power constraint. As an example, a complex first-order IIR section with pole of p=0.625+j 0.625 does not meet the power constraint. However, a filter bank with pole of $p^2$=j 0.78 meets the power constraint.

Equation (35) is for a 2-way interleaved filter bank with M=2. In general, the power constraint for an M-way interleaved filter bank may be expressed as:

$$|\check{p}_{re}|+|\check{p}_{im}|=r^M \cdot (|\cos M\cdot\theta|+|\sin M\cdot\theta|) \leq 1. \quad \text{Eq (36)}$$

In theory, the power constraint can always be satisfied if M is sufficiently large. However, a larger M also corresponds to greater complexity for the IIR part.

Figure 17:
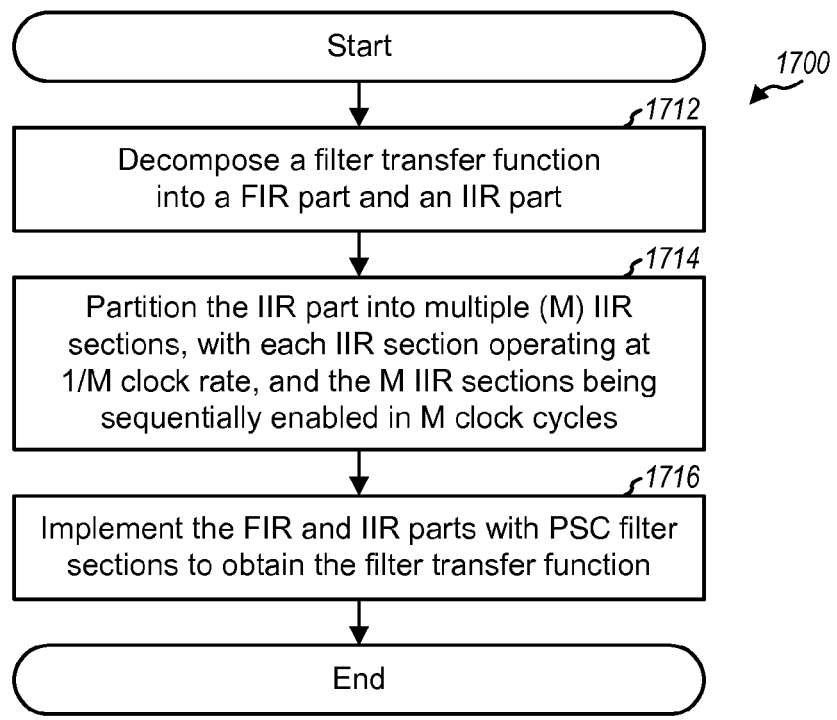
FIG. 17 shows a process for designing a PSC filter with filter bank transformation.

FIG. 17 shows a process 1700 for designing a PSC filter with filter bank transformation. A filter transfer function may be decomposed into a FIR part and an IIR part (block 1712). In one design, the filter transfer function is for a complex first-order IIR filter and may be decomposed into the FIR part and the IIR part. A complex coefficient (e.g., $p^M$) for the IIR part may be determined based on a complex coefficient (e.g., p) for the complex first-order IIR filter. The IIR part may be partitioned into multiple (M) IIR sections, with each IIR section operating at 1/M clock rate, and the M IIR sections being sequentially enabled in M clock cycles (block 1714). In one design, the IIR part may be partitioned into first and second IIR sections, with the first IIR section being enabled in even-numbered clock cycles, and the second IIR section being enabled in odd-numbered clock cycles. The FIR and IIR parts may be implemented with PSC filter sections to obtain the filter transfer function (block 1716).

In a fourth scheme for meeting the power constraint for IIR filter, pole repositioning may be performed, and a pole may be moved to a more suitable location in order to meet the power constraint. The second part of the right hand side of equation (22) may be expressed as:

$$f(\theta)=(|\cos \theta|+|\sin \theta|). \quad \text{Eq (37)}$$

Figure 18:
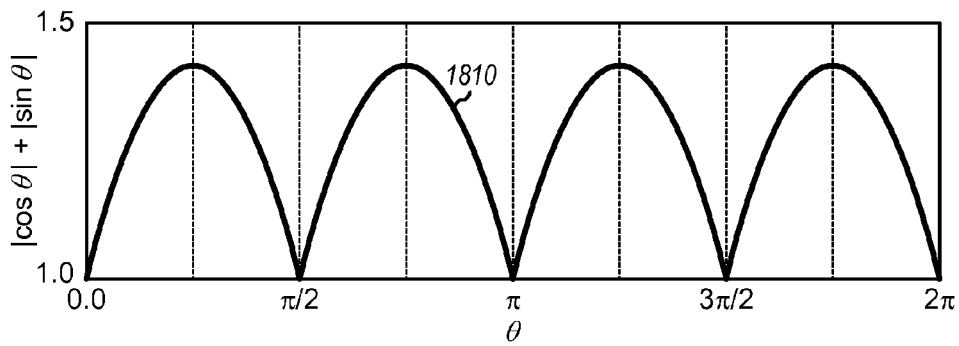
FIG. 18 shows a plot of a function affecting power constraint.

FIG. 18 shows a plot 1810 of function $f(\theta)$ in equation (37). Function $f(\theta)$ has a minimum value of 1.0 for $\theta=i\cdot\pi/2$, where i is an integer. In order to meet the power constraint $|p_{re}|+|p_{im}|$<1, it is better to minimize $f(\theta)$, which means making either $\theta$ or $M\cdot\theta$ close to $i\cdot\pi/2$. It may be desirable to have $\theta\approx\pi/2$, so that the poles are on the imaginary axis. If the interleaved filter bank with M=2 is used, then it may be desirable to have $\theta\approx\pi/4$ or $\theta\approx3\pi/4$. This may be achieved by a multi-rate filter design.

For the fourth scheme, the pole location may be varied in a systematic or pseudo-random manner. The pole at each new location may be evaluated to determine whether (i) a desired filter response can be obtained with the new pole location and (ii) the power constraint is met with the new pole location.

Figure 19:
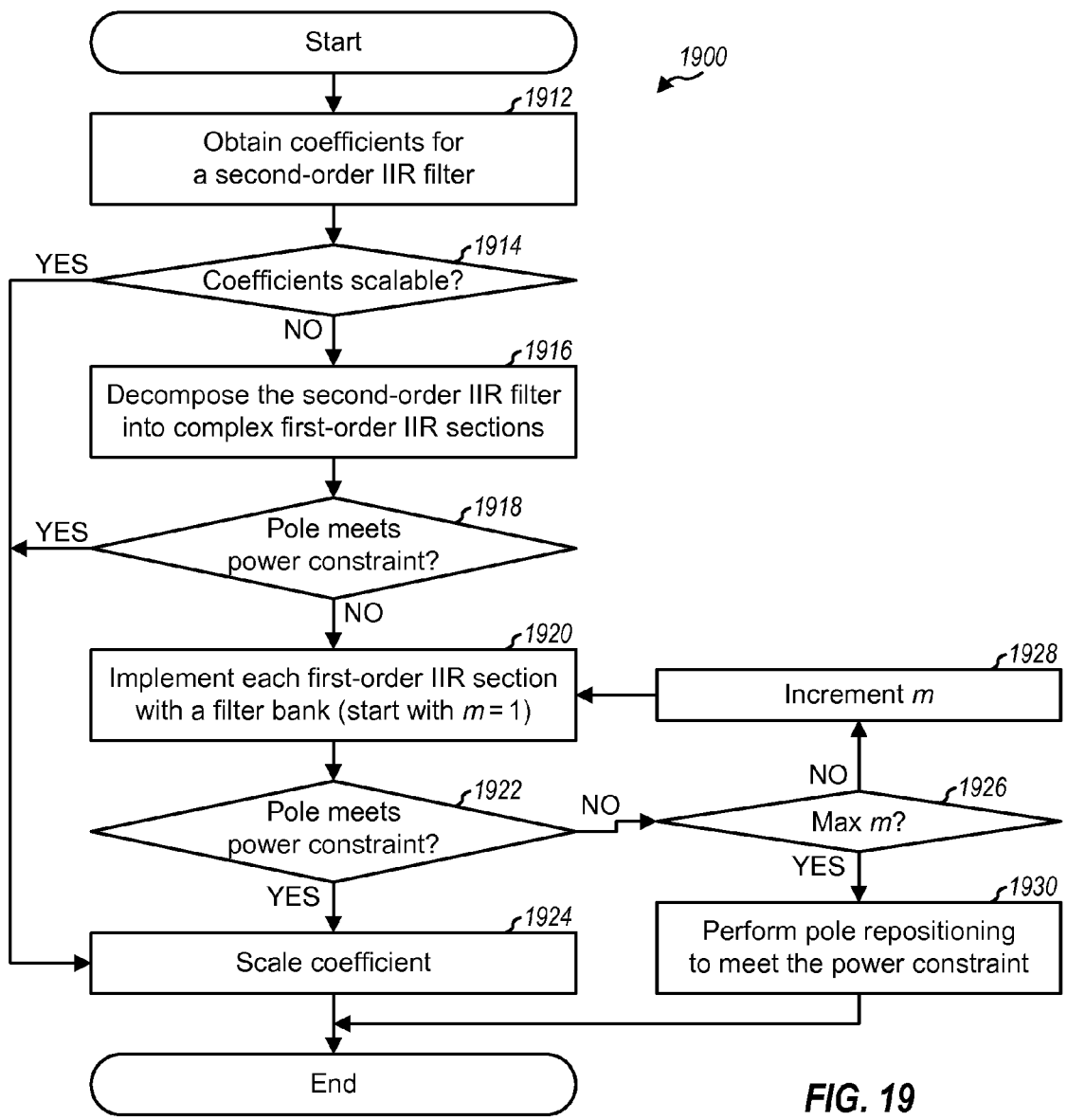
FIG. 19 shows a process for designing an IIR filter to meet power constraint.

FIG. 19 shows a process 1900 for designing a second-order IIR filter to meet power constraint. The second-order IIR filter may be designed to meet applicable system requirements. The coefficients $c_0$, $c_1$ and $c_2$ of the second-order IIR filter may be obtained (block 1912). A determination is made whether the coefficients can be scaled, e.g., whether $|c_1|+|c_2|$<1 (block 1914). If the answer is 'Yes' for block 1914, then coefficient scaling may be performed to obtain coefficient $c_0'$ as shown in equation (15) (block 1924). Otherwise, the second-order IIR filter may be decomposed into complex first-order IIR sections (block 1916). A determination is made whether the pole of the first-order IIR sections meet the power constraint, e.g., whether $|p_{re}|+|p_{im}|<1$ (block 1918). If the answer is 'Yes' for block 1918, then coefficient scaling may be performed to obtain coefficient $\tilde{c}_0$ as shown in equation (22) (block 1924).

Otherwise, each complex first-order IIR section may be implemented with a filter bank starting with m=1 (block 1920). A determination is made whether the pole for the filter bank meets the power constraint, e.g., whether $|\breve{p}_{re}|+|\breve{p}_{im}|<1$ (block 1922). If the answer is 'Yes' for block 1922, then coefficient scaling may be performed to obtain coefficient $\tilde{c}_0$ as shown in equation (33) (block 1924). Otherwise, a determination is made whether m is equal to a maximum value (block 1926). If the answer is 'No', then m may be incremented (block 1928), and the process may then return to block 1920. Otherwise, pole repositioning may be performed in order to meet the power constraint (block 1930).

For clarity, much of the description above is for second-order FIR filter and first-order and second-order IIR filters. The PSC filters described herein may be used for FIR filters and IIR filters of any order.

The PSC filters described herein may provide certain advantages. First, the PSC filters do not utilize amplifiers within the PSC filters, which may reduce size and power consumption. Amplifiers may be used for input/output buffering. Second, the PSC filters may be able to provide an accurate frequency response, which is determined by capacitor ratios that can be more accurately achieved in an integrated circuit (IC). Third, the PSC filters may have high adaptability since it uses an array of capacitors that may be configured during operation, e.g., to obtain different filter responses.

The PSC filters described herein may be used for various applications such as wireless communication, computing, networking, consumer electronics, etc. The PSC filters may also be used for various devices such as wireless communication devices, cellular phones, broadcast receivers, personal digital assistants (PDAs), handheld devices, wireless modems, laptop computers, cordless phones, Bluetooth devices, wireless local loop (WLL) stations, consumer electronics devices, etc. For clarity, the use of the PSC filters in a wireless communication device, which may be a cellular phone or some other device, is described below. The PSC filters may be used to pass a desired signal, to attenuate jammers and out-of-band noise and interference, and/or to perform other functions in the wireless device.

Figure 20:
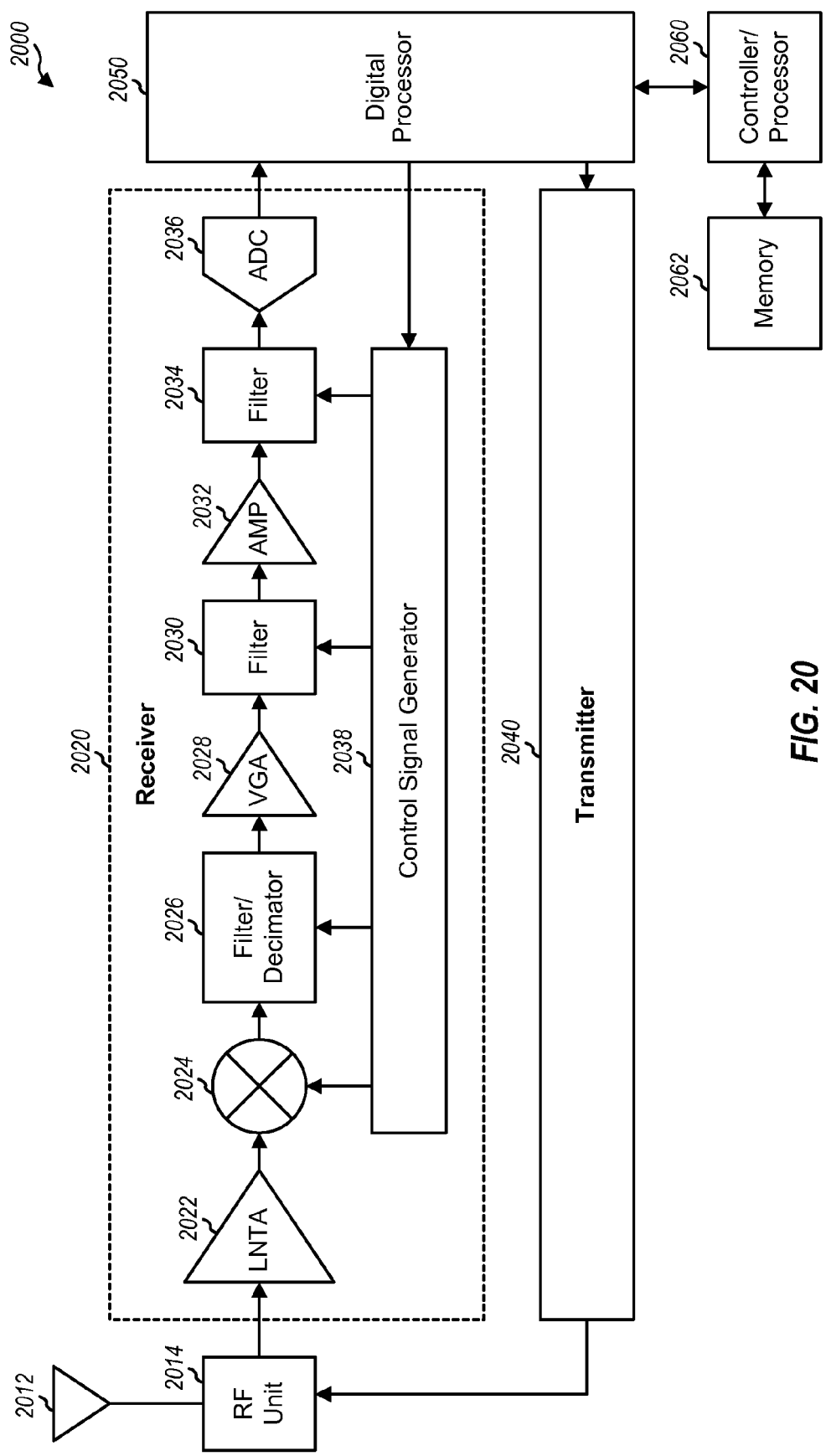
FIG. 20 shows a block diagram of a wireless communication device.

FIG. 20 shows a block diagram of a design of a wireless communication device 2000 in which the PSC filter described herein may be implemented. Wireless device 2000 includes a receiver 2020 and a transmitter 2040 that support bi-directional communication. In general, wireless device 2000 may include any number of receivers and any number of transmitters for any number of communication systems and frequency bands.

In the receive path, an antenna 2012 may receive radio frequency (RF) modulated signals transmitted by base stations and provide a received RF signal, which may be routed through an RF unit 2014 and provided to receiver 2020. RF unit 2014 may include an RF switch and/or a duplexer that can multiplex RF signals for the transmit and receive paths. Within receiver 2020, a low noise transconductance amplifier (LNTA) 2022 may amplify the received RF signal (which may be a voltage signal) and provide an amplified RF signal (which may be a current signal). A passive sampler 2024 may sample the amplified RF signal, perform frequency downconversion via a sampling operation, and provide analog samples. An analog sample is an analog value for a discrete time instant. A filter/decimator 2026 may filter the analog samples, perform decimation, and provide filtered samples at a lower sample rate. Filter/decimator 2026 may be implemented with the PSC filters described herein.

The filtered samples from filter/decimator 2026 may be amplified by a variable gain amplifier (VGA) 2028, filtered by a filter 2030, further amplified by an amplifier (AMP) 2032, further filtered by a filter 2034, and digitized by an analog-to-digital converter (ADC) 2036 to obtain digital samples. Filter 2030 and/or 2034 may be implemented with the PSC filters described herein. VGA 2028 and/or amplifier 2032 may be implemented with switched-capacitor amplifiers that can amplify the analog samples from filters 2026 and 2030. A digital processor 2050 may process the digital samples to obtain decoded data and signaling. A control signal generator 2038 may generate a sampling clock for passive sampler 2024 and control signals for filters 2026, 2030 and 2034.

In the transmit path, transmitter 2040 may process output samples from digital processor 2050 and provide an output RF signal, which may be routed through RF unit 2014 and transmitted via antenna 2012. For simplicity, details of transmitter 2040 are not shown in FIG. 20.

Digital processor 2050 may include various processing units for data transmission and reception as well as other functions. For example, digital processor 2050 may include a digital signal processor (DSP), a reduced instruction set computer (RISC) processor, a central processing unit (CPU), etc. A controller/processor 2060 may control the operation at wireless device 2000. A memory 2062 may store program codes and data for wireless device 2000. Data processor 2050, controller/processor 2060, and/or memory 2062 may be implemented on one or more application specific integrated circuits (ASICs) and/or other ICs.

FIG. 20 shows a specific design of receiver 2020. In general, the conditioning of the signals within receiver 2020 may be performed by one or more stages of mixer, amplifier, filter, etc. These circuit blocks may be arranged differently from the configuration shown in FIG. 20. Furthermore, other circuit blocks not shown in FIG. 20 may also be used to condition the signals in the receiver. Some circuit blocks in FIG. 20 may also be omitted. All or a portion of receiver 2020 may be implemented on one or more RF ICs (RFICs), mixed-signal ICs, etc.

The received RF signal from antenna 2012 may contain both a desired signal and jammers. A jammer is a large amplitude undesired signal close in frequency to a desired signal. The jammers may be attenuated prior to ADC 2036 in order to avoid saturation of the ADC. Filters 2026, 2030 and/or 2034 may attenuate the jammers and other out-of-band noise and interference and may each be implemented with any of the PSC filters described herein.

The PSC filters described herein may be implemented on an IC, an analog IC, an RFIC, a mixed-signal IC, an ASIC, a printed circuit board (PCB), an electronics device, etc. The PSC filters may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the PSC filters described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computers. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    a first filter section comprising:
        a first set of capacitors operative to receive a real input signal and an imaginary delayed signal, to store and share electrical charges, and to provide a real filtered signal, wherein the first set of capacitors comprises:
            a first capacitor operative to receive and store the real input signal, to share electrical charge, and to provide the real filtered signal in each clock cycle, and
            a second capacitor operative to share electrical charge and to store the real filtered signal in each clock cycle;
        a second set of capacitors operative to receive an imaginary input signal and a real delayed signal, to store and share electrical charges, and to provide an imaginary filtered signal; and
        a third set of capacitors operative to receive the real and imaginary filtered signals, to store and share electrical charges, and to provide the real and imaginary delayed signals.

2. The apparatus of claim 1, wherein the second set of capacitors comprises
    a third capacitor operative to receive and store the imaginary input signal, to share electrical charge, and to provide the imaginary filtered signal in each clock cycle, and
    a fourth capacitor operative to share electrical charge and to store the imaginary filtered signal in each clock cycle.

3. The apparatus of claim 2, wherein the third set of capacitors comprises
    a fifth capacitor operative to share electrical charge in each clock cycle, to store the real filtered signal in each even-numbered clock cycle, and to store the imaginary filtered signal in each odd-numbered clock cycle, and
    a sixth capacitor operative to share electrical charge in each clock cycle, to store the imaginary filtered signal in each even-numbered clock cycle, and to store the real filtered signal in each odd-numbered clock cycle.

4. The apparatus of claim 1, wherein each capacitor in the first, second and third sets is operative to store a value from an associated summing node when selected for charging and to share electrical charge with other capacitors via the associated summing node when selected for charge sharing.

5. The apparatus of claim 1, wherein the first filter section further comprises
    a first switch operative to couple a capacitor in the first set to a first summing node;
    a second switch operative to couple a capacitor in the second set to a second summing node;
    a first set of switches operative to couple the third set of capacitors to the first summing node; and
    a second set of switches operative to couple the third set of capacitors to the second summing node.

6. The apparatus of claim 5, wherein each switch is operative to couple an associated capacitor to an associated summing node when enabled and to decouple the associated capacitor from the associated summing node when disabled.

7. The apparatus of claim 5, wherein the first filter section further comprises
    a first input switch operative to couple the real input signal to the first summing node when the first input switch is enabled;
    a first output switch operative to couple the first summing node to the real filtered signal when the first output switch is enabled; and
    a first reset switch operative to couple the first summing node to circuit ground and to reset a capacitor coupled directly to the first summing code when the first reset switch is enabled.

8. The apparatus of claim 7, wherein the first filter section further comprises
    a second input switch operative to couple the imaginary input signal to the second summing node when the second input switch is enabled;
    a second output switch operative to couple the second summing node to the imaginary filtered signal when the second output switch is enabled; and
    a second reset switch operative to couple the second summing node to circuit ground and to reset a capacitor coupled directly to the second summing code when the second reset switch is enabled.

9. The apparatus of claim 1, further comprising:
    a second filter section coupled to the first filter section and comprising a fourth set of capacitors operative to receive the real filtered signal and an imaginary delayed output signal, to store and share electrical charges, and to provide a real output signal;

a fifth set of capacitors operative to receive the imaginary filtered signal and a real delayed output signal, to store and share electrical charges, and to provide an imaginary output signal; and a sixth set of capacitors operative to receive the real and imaginary output signals, to store and share electrical charges, and to provide the real and imaginary delayed output signals.

10. The apparatus of claim 9, wherein the first and second filter sections each implement a complex first-order infinite impulse response (IIR) section and collectively implement a complex second-order IIR filter.

11. The apparatus of claim 1, wherein the apparatus is an integrated circuit.

12. A wireless device comprising:
at least one passive switched-capacitor (PSC) filter, each PSC filter comprising at least one filter section operative to receive and filter a complex input signal and provide a complex filtered signal for the PSC filter, wherein a filter section for each PSC filter comprises:
a first set of capacitors operative to receive a real input signal and an imaginary delayed signal, to store and share electrical charges, and to provide a real filtered signal, wherein the first set of capacitors comprises:
a first capacitor operative to receive and store the real input signal, to share electrical charge, and to provide the real filtered signal in each clock cycle, and
a second capacitor operative to share electrical charge and to store the real filtered signal in each clock cycle,
a second set of capacitors operative to receive an imaginary input signal and a real delayed signal, to store and share electrical charges, and to provide an imaginary filtered signal, and
a third set of capacitors operative to receive the real and imaginary filtered signals, to store and share electrical charges, and to provide the real and imaginary delayed signals; and
a signal generator operative to generate control signals for the at least one PSC filter.

13. The wireless device of claim 12, wherein each PSC filter is operative to receive analog input samples for the complex input signal and to provide analog output samples for the complex filtered signal, and wherein the wireless device further comprises
an analog-to-digital converter (ADC) operative to digitize the complex filtered signal from a last PSC filter and provide digital samples.

14. The wireless device of claim 12, wherein each PSC filter comprises two complex first-order infinite impulse response (IIR) filter sections.

15. The wireless device of claim 12, wherein each PSC filter comprises a finite impulse response (FIR) filter section and an infinite impulse response (IIR) filter section.

16. A method comprising:
receiving a real input signal and an imaginary delayed signal by a first set of capacitors in a first filter section, wherein the first set of capacitors is operative to store and share electrical charges, and to provide a real filtered signal, wherein the first set of capacitors comprises:
a first capacitor operative to receive and store the real input signal, to share electrical charge, and to provide the real filtered signal in each clock cycle, and
a second capacitor operative to share electrical charge and to store the real filtered signal in each clock cycle;
receiving an imaginary input signal and a real delayed signal by a second set of capacitors, wherein the second set of capacitors is operative to store and share electrical charges, and to provide an imaginary filtered signal; and
receiving the real and imaginary filtered signals by a third set of capacitors, wherein the third set of capacitors is operative to store and share electrical charges, and to provide the real and imaginary delayed signals.

17. The method of claim 16, wherein the second set of capacitors comprises
a third capacitor operative to receive and store the imaginary input signal, to share electrical charge, and to provide the imaginary filtered signal in each clock cycle, and
a fourth capacitor operative to share electrical charge and to store the imaginary filtered signal in each clock cycle.

18. The method of claim 17, wherein the third set of capacitors comprises
a fifth capacitor operative to share electrical charge in each clock cycle, to store the real filtered signal in each even-numbered clock cycle, and to store the imaginary filtered signal in each odd-numbered clock cycle, and
a sixth capacitor operative to share electrical charge in each clock cycle, to store the imaginary filtered signal in each even-numbered clock cycle, and to store the real filtered signal in each odd-numbered clock cycle.

19. The method of claim 16, wherein each capacitor in the first, second and third sets is operative to store a value from an associated summing node when selected for charging and to share electrical charge with other capacitors via the associated summing node when selected for charge sharing.

20. The method of claim 16, wherein the first filter section further comprises
a first switch operative to couple a capacitor in the first set to a first summing node;
a second switch operative to couple a capacitor in the second set to a second summing node;
a first set of switches operative to couple the third set of capacitors to the first summing node; and
a second set of switches operative to couple the third set of capacitors to the second summing node.

21. The method of claim 20, wherein each switch is operative to couple an associated capacitor to an associated summing node when enabled and to decouple the associated capacitor from the associated summing node when disabled.

22. The method of claim 20, wherein the first filter section further comprises
a first input switch operative to couple the real input signal to the first summing node when the first input switch is enabled;
a first output switch operative to couple the first summing node to the real filtered signal when the first output switch is enabled; and
a first reset switch operative to couple the first summing node to circuit ground and to reset a capacitor coupled directly to the first summing code when the first reset switch is enabled.

23. The method of claim 22, wherein the first filter section further comprises
a second input switch operative to couple the imaginary input signal to the second summing node when the second input switch is enabled;
a second output switch operative to couple the second summing node to the imaginary filtered signal when the second output switch is enabled; and a second reset switch operative to couple the second summing node to circuit ground and to reset a capacitor coupled directly to the second summing code when the second reset switch is enabled.

24. The method of claim 16, further comprising:

receiving the real filtered signal and an imaginary delayed output signal by a fourth set of capacitors in a second filter section coupled to the first filter section, wherein the fourth set of capacitors is operative to store and share electrical charges, and to provide a real output signal;

receiving the imaginary filtered signal and a real delayed output signal by a fifth set of capacitors, wherein the fifth set of capacitors is operative to store and share electrical charges, and to provide an imaginary output signal; and receiving the real and imaginary output signals by a sixth set of capacitors, wherein the sixth set of capacitors is operative to store and share electrical charges, and to provide the real and imaginary delayed output signals.

25. The method of claim 24, wherein the first and second filter sections each implement a complex first-order infinite impulse response (IIR) section and collectively implement a complex second-order IIR filter.

26. An apparatus comprising:

means for receiving a real input signal and an imaginary delayed signal, wherein the means for receiving a real input signal and an imaginary delayed signal is operative to store and share electrical charges, and to provide a real filtered signal, wherein the means for receiving a real input signal and an imaginary delayed signal comprises:

a first capacitor operative to receive and store the real input signal, to share electrical charge, and to provide the real filtered signal in each clock cycle, and a second capacitor operative to share electrical charge and to store the real filtered signal in each clock cycle;

means for receiving an imaginary input signal and a real delayed signal, wherein the means for receiving an imaginary input signal and a real delayed signal is operative to store and share electrical charges, and to provide an imaginary filtered signal; and means for receiving the real and imaginary filtered signals, wherein the means for receiving the real and imaginary filtered signals is operative to store and share electrical charges, and to provide the real and imaginary delayed signals.

27. The apparatus of claim 26, wherein the means for receiving an imaginary input signal and a real delayed signal comprises a third capacitor operative to receive and store the imaginary input signal, to share electrical charge, and to provide the imaginary filtered signal in each clock cycle, and a fourth capacitor operative to share electrical charge and to store the imaginary filtered signal in each clock cycle.

28. The apparatus of claim 27, wherein the means for receiving the real and imaginary filtered signals comprises a fifth capacitor operative to share electrical charge in each clock cycle, to store the real filtered signal in each even-numbered clock cycle, and to store the imaginary filtered signal in each odd-numbered clock cycle, and a sixth capacitor operative to share electrical charge in each clock cycle, to store the imaginary filtered signal in each even-numbered clock cycle, and to store the real filtered signal in each odd-numbered clock cycle.

29. The apparatus of claim 26, wherein each capacitor is operative to store a value from an associated summing node when selected for charging and to share electrical charge with other capacitors via the associated summing node when selected for charge sharing.

30. The apparatus of claim 26, further comprising:

means for coupling a capacitor in the means for receiving a real input signal and an imaginary delayed signal to a first summing node;

means for coupling a capacitor in the means for receiving an imaginary input signal and a real delayed signal to a second summing node;

means for coupling the means for receiving the real and imaginary filtered signals to the first summing node; and means for coupling the means for receiving the real and imaginary filtered signals to the second summing node.

* * * * *